(12) United States Patent
Park et al.

(10) Patent No.: US 7,884,035 B2
(45) Date of Patent: Feb. 8, 2011

(54) METHOD OF CONTROLLING FILM UNIFORMITY AND COMPOSITION OF A PECVD-DEPOSITED A-SIN$_x$ : H GATE DIELECTRIC FILM DEPOSITED OVER A LARGE SUBSTRATE SURFACE

(75) Inventors: Beom Soo Park, San Jose, CA (US);
Soo Young Choi, Fremont, CA (US);
Tae Kyung Won, San Jose, CA (US);
John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 12/082,554

(22) Filed: Apr. 11, 2008

(65) Prior Publication Data
US 2008/0268175 A1  Oct. 30, 2008

Related U.S. Application Data

(63) Continuation of application No. 10/897,775, filed on Jul. 23, 2004, now abandoned.

(51) Int. Cl.
*H01L 21/31* (2006.01)
*H01L 21/469* (2006.01)

(52) U.S. Cl. ............... 438/792; 438/151; 257/E21.293

(58) Field of Classification Search .................. None
See application file for complete search history.

(56) References Cited

U.S. PATENT DOCUMENTS

| | | | |
|---|---|---|---|
| 4,724,323 A * | 2/1988 | Fukaya et al. ........... | 250/370.08 |
| 4,746,535 A * | 5/1988 | Fukaya et al. ........... | 427/578 |
| 4,763,010 A * | 8/1988 | Fukaya et al. ........... | 250/208.1 |
| 4,863,755 A * | 9/1989 | Hess et al. .............. | 427/574 |
| 5,135,607 A * | 8/1992 | Hirai ...................... | 216/37 |
| 5,319,479 A * | 6/1994 | Yamada et al. .......... | 349/138 |
| 5,342,387 A | 8/1994 | Summers ................. | 136/256 |
| 5,342,452 A * | 8/1994 | Saito et al. .............. | 136/256 |

(Continued)

FOREIGN PATENT DOCUMENTS

EP  1168427  1/2002

OTHER PUBLICATIONS

E.J. Kim et al., "Modeling of SiO2 CVD from TEOS/Ozone in a Separate-Gas-Injection Reactor," *Korean J. Chem. Eng.*, vol. 15, No. 1, pp. 56-63 (1998).

(Continued)

*Primary Examiner*—Jarrett J Stark
(74) *Attorney, Agent, or Firm*—Shirley L. Church, Esq.

(57) ABSTRACT

We have discovered that adding $H_2$ to a precursor gas composition including $SiH_4$, $NH_3$, and $N_2$ is effective at improving the wet etch rate and the wet etch rate uniformity across the substrate surface of a-SiN$_x$:H films which are deposited on a substrate by PECVD. Wet etch rate is an indication of film density. Typically, the lower the wet etch rate, the denser the film. The addition of $H_2$ to the $SiH_4/NH_3/N_2$ precursor gas composition did not significantly increase the variation in deposited film thickness across the surface of the substrate. The uniformity of the film across the substrate enables the production of flat panel displays having surface areas of 25,000 cm$^2$ and larger.

20 Claims, 10 Drawing Sheets

300 {
ITO PATTERN (MASK5)
ITO SPUTTERING
PASSIVATION ETCH (MASK4)
SiNx PECVD
n+ a-Si ETCH-BACK
S/D PATTERN (MASK3)
S/D SPUTTERING
a-Si PATTERN (MASK2)
n+a-Si/a-Si/SiNx PECVD
GATE PATTERN (MASK1)
GATE METAL SPUTERRING
}

U.S. PATENT DOCUMENTS

| | | | | |
|---|---|---|---|---|
| 5,399,387 | A | | 3/1995 | Law et al. .................... 427/574 |
| 5,674,599 | A | * | 10/1997 | Yamada ...................... 428/212 |
| 5,928,732 | A | | 7/1999 | Law et al. .................... 427/579 |
| 6,120,661 | A | * | 9/2000 | Hirano et al. .......... 204/298.15 |
| 7,125,758 | B2 | * | 10/2006 | Choi et al. .................. 438/151 |
| 2001/0021422 | A1 | * | 9/2001 | Yamakoshi et al. ......... 427/569 |
| 2002/0146879 | A1 | | 10/2002 | Fu et al. ...................... 438/230 |
| 2002/0160553 | A1 | * | 10/2002 | Yamanaka et al. .......... 438/149 |
| 2002/0191660 | A1 | * | 12/2002 | Wittman et al. ............... 372/49 |
| 2003/0082859 | A1 | * | 5/2003 | Ichijo et al. ................. 438/166 |

OTHER PUBLICATIONS

S.K. Kim et al., "A Novel Self-Aligned Coplanar Amorphous Silicon Thin Fiml Transistor," ISSN-0098-096X/98/2901 (1998).

L. Kyung-ha, "A Study on Laser Annealed Polycrystalline Silicon Thin Film Transistors (TFTs) with SiNx Gate Insulator, Chapter 2. Review of ELA Poly-Si TFT-LCDs", Kyung Hee University, Ch. 2 (1998). http://tftlcd.kyunghee.ac.kr/research/poly-Si.

Y. B. Park, et al., "Bulk and Interface Properties of Low-Temperature Silicon Nitride Films Deposited By Remote Plasma Enhanced Chemical Vapor Deposition", *Journal of Materials Science: Materials in Electronics*, vol. 12, pp. 515-522 (2001).

A. Sazonov, et al., "Low Temperature a-Si:H TFT on Plastic Films: Materials and Fabrication Aspects", *Proc. 23$^{rd}$ International Conference on Microelectronics* (*MIEL 2002*), vol. 2, pp. 525-528 (May 2002).

D. B. Thomasson et al., "High Mobility Tri-Layer a-Si:H Thin Film Transistors with Ultra-Thin Active Layer", *IEEE Electron Device Letters*, vol. 18, No. 8, pp. 397-399, (Aug. 1997).

International Search Report from corresponding PCT Appln. No. PCT/US2005/25528.

* cited by examiner

METHOD OF CONTROLLING FILM UNIFORMITY AND COMPOSITION OF A PECVD-DEPOSITED A-SIN$_x$ : H GATE DIELECTRIC FILM DEPOSITED OVER A LARGE SUBSTRATE SURFACE

The present application is a continuation application of U.S. application Ser. No. 10/897,775, filed Jul. 23, 2004 now abandoned, and titled "Method Of Controlling The Film Properties Of a CVD-Deposited Silicon Nitride Film", which is presently pending.

BACKGROUND OF THE INVENTION

1. Field of the Invention

The present invention pertains to a method of controlling the film properties of a silicon nitride film deposited by PECVD (plasma-enhanced chemical vapor deposition) over a substrate having a large surface area, and to the film deposited by the method. In particular, the uniformity of the density of the silicon nitride film across the substrate surface is improved by controlling the film-forming precursors.

2. Brief Description of the Background Art

Current interest in thin film transistor (TFT) arrays is particularly high because these devices are used in liquid crystal active matrix displays of the kind often employed for computer and television flat panels. The liquid crystal active matrix displays may also contain light emitting diodes for back lighting. Further, organic light emitting diodes (OLEDs) have been used for active matrix displays, and these organic light emitting diodes require TFTs for addressing the activity of the displays.

The TFT arrays are typically created on a flat substrate. The substrate may be a semiconductor substrate, or may be a transparent substrate such as glass, quartz, sapphire, or a clear plastic film. The TFT which is the subject of the present invention employs silicon-containing films, and in particular employs silicon nitride containing films for dielectric layers. A first silicon nitride-comprising film is referred to as the gate dielectric because it overlies the conductive gate electrode. A second silicon nitride-comprising film is referred to as the passivation dielectric and overlies the upper surface of a second conductive electrode, to electrically isolate the second conductive electrode from the ambient surrounding the upper surface of the TFT device (where the lower surface of the TFT device is the glass, quartz, sapphire, plastic, or semiconductor substrate).

FIG. 1 illustrates a schematic cross-sectional view of a thin film transistor structure of the kind which may employ both a silicon nitride-comprising gate dielectric film and a silicon nitride-comprising passivation dielectric film. This kind of thin film transistor is frequently referred to as an inverse staggered α-Si TFT, with a SiN$_x$ layer as a gate insulator or as a back channel etch (BCE) inverted staggered (bottom gate) TFT structure. This structure is one of the more preferred TFT structures because the gate dielectric (SiN$_x$) and the intrinsic as well as n+ (or p+) doped amorphous silicon films can be deposited in a single PECVD pump-down run. The BCE TFT shown in FIG. 1 involves only four or five patterning masks.

As previously mentioned, the substrate 101 typically comprises a material that is essentially optically transparent in the visible spectrum, such as glass, quartz, sapphire, or a clear plastic. The substrate may be of varying shapes or dimensions. Typically, for TFT applications, the substrate is a glass substrate with a surface area greater than about 500 mm². A gate electrode layer 102 is formed on the substrate 101. The gate electrode layer 102 may comprise a metal layer such as, for example, aluminum (Al), tungsten (W), chromium (Cr), tantalum (Ta), molybdenum (Mo), molybdenum tungsten (MoW), titanium (Ti), or combinations thereof, among others. The gate electrode layer 102 may be formed using conventional deposition, lithography, and etching techniques. Between the substrate 101 and the gate electrode layer 102, there may be an optional (not shown) insulating layer, for example, such a silicon oxide, or silicon nitride, which may also be formed using a PECVD system of the kind which will be described later herein.

A gate dielectric layer 103 is formed on the gate electrode layer 102. The gate dielectric layer may be silicon oxide, silicon oxynitride, or silicon nitride, deposited using such a PECVD system. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon), microcrystalline silicon (μc-Si), or amorphous silicon (α-silicon), which films can also be deposited using a PECVD system, or other conventional methods known in the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycyrstalline, microcrystalline, or amorphous silicon. Doped semiconductor layer 105 may be deposited to a thickness within a range of about 100 Å to about 3000 Å. An example of the doped semiconductor layer 105 is n+ doped α-silicon film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surfaces of gate dielectric layer 103, semiconductor layer 104, and doped semiconductor layer 105. The conductive layer 106 may comprise a metal such as, for example, aluminum, tungsten, molybdenum, chromium, tantalum, and combinations thereof, among others. The conductive layer 106 may be formed using conventional deposition techniques. Both the conductive layer 106 and doped semiconductor layer 105 may be lithographically patterned to define source and drain contacts of the TFT, 106a and 106b, respectively in FIG. 1. After formation of the source and drain contacts 106a and 106b, a passivation dielectric layer 107 is typically applied. The passivation dielectric layer may be, for example, a silicon oxide or a silicon nitride. The passivation layer 107 may be formed using, for example, PECVD or other conventional methods known in the art. The passivation layer 107 may be deposited to a thickness in the range of about 1000 Å to about 5000 Å. The passivation layer 107 is then lithographically patterned and etched using conventional techniques, to open contact holes in the passivation layer.

A transparent electrically conductive layer 108 is then deposited and patterned to make contacts with the conductive layer 106. The transparent conductor layer 108 comprises a material that is essentially optically transparent in the visible spectrum. Transparent conductor 108 may comprise, for example, indium tin oxide (ITO) or zinc oxide among others. Patterning of the transparent electrically conductive layer 108 is accomplished by conventional lithographic and etching methods.

There are a number of additional TFT structures which can employ silicon nitride gate insulators, and several of these are presented in a disclosure entitled "A Study on Laser Annealed Polycrystalline Silicon Thin Film Transistors (TFTs) with SiNx Gate Insulator", by Dr. Lee Kyung-ha (Kyung Hee University, 1998). (This disclosure is available at http://tftcd.khu.ac.kr/research/polySi.) Dr. Lee Kyung-ha's disclosure pertains mainly to the use of laser annealed poly-Si TFTs, which is not the subject matter of the present invention, but the TFT structures are of interest as background material. The structures of interest are presented in Chapter 2 of the disclosure.

D. B. Thomasson et al., in an article entitled: "High Mobility Tri-Layer a-Si:H Thin Film Transistors with Ultra-Thin Active Layer", 1977 Society for Information Display International Symposium Digest of Technical Papers, Vol. 28, pages 176-179, describe active matrix liquid crystal displays where the TFT has an active layer thickness of about 13 nm. The TFT structure is a glass substrate with a molybdenum bottom electrode, a silicon nitride gate dielectric layer, an a-Si:H layer overlying the silicon nitride gate dielectric layer, n+ µc-Si:H doped source and drain regions, separated by a silicon nitride dielectric mesa, and with an aluminum contact layer overlying each source and drain region. This is referred to as a tri-layer a-Si:H TFT structure. The authors claim that such hydrogenated amorphous silicon thin-film transistors with active layer thickness of 13 nm perform better for display applications than devices with thicker (50 nm) active layers. The linear ($V_{DS}$=0.1V) and saturation region mobility of a 5 µm channel length device is said to increase from 0.4 $cm^2$/V·sec and 0.7 $cm^2$/V·sec for a 50 nm a-Si:H device, to 0.7 $cm^2$/V·sec and 1.2 $cm^2$/V·sec for a 13 mn a-Si:H layer device fabricated with otherwise identical geometry and processing. The gate dielectric silicon nitride was deposited from a reactant gas mixture of $SiH_4$, $NH_3$, and Ar at 100 mW/$cm^2$, −150 V, 0.5 Torr, and 300° C. The passivation silicon nitride dielectric layer was deposited at the same conditions as the gate dielectric, with the exception of substrate temperature, which was 250° C.

Young-Bae Park et al., in an article entitled: "Bulk and interface properties of low-temperature silicon nitride films deposited by remote plasma enhanced chemical vapor deposition", Journal of Materials Science: Materials in Electronics, Vol. 23, pp. 515-522 (2001), describe problems which occur when a gate dielectric, rather than being $SiN_x$, is a hydrogenated silicon nitride film (a-$SiN_x$:H). PECVD a-$SiN_x$:H thin films are said to be widely used as a gate dielectric for a-Si:H TFT applications, due to the good interfacial property between an a-Si:H layer and an a-Si:$N_x$:H layer. However, the a-Si:H TFTs with $SiN_x$:H gate dielectric are said to have instability problems, such as the threshold voltage shift and the inverse subthreshold slope under a DC gate voltage bias. Their instability problems are said to be caused by the high trap density in the $SiN_x$:H film and the defects created at the a-Si:H/$SiN_x$:H interface. Charge trapping in the SiN:H is said to be from the electron injection under an applied field, and due to the localized states of the Si dangling bonds, Si—H and N—H bonds in the forbidden gap. The authors claim that PECVD $SiN_x$:H dielectric films are not useful as a gate insulator because they contain large amounts of bonded hydrogen (20%-40%) in the form of N—H and Si-H bonds.

The authors propose that a remote plasma enhanced chemical vapor deposition of the gate dielectric layer be carried out. The $NH_3$ precursor is excited in a remote plasma zone (at the top of the chamber) to produce NH* or $NH_2$*+H*, after which the activated species* from the plasma zone react with $SiH_4$ introduced downstream through a gas dispersal ring to form the $SiN_x$:H electrical insulator with a reduction in the amounts of bonded hydrogen in the form of Si—H bonds, which are said to easily lose hydrogen to form a dangling bond of the kind known to reduce performance of the TFT device over time.

A presentation entitled "Low Temperature a-Si:H TFT on Plastic Films: Materials and Fabrication Aspects", by Andrei Sazonov et al., Proc. 23rd International Conference on Microelectronics (MIEL 2002), Vol. 2, NIS, Yugoslavia, 12-15 May 2002, related to fabrication technology for a-SiH thin film transistors at 120° C. for active matrix OLED displays on flexible plastic substrates. The TFTs produced were said to demonstrate performance very close to those fabricated at 260° C. The authors claim that with the proper pixel integration, amorphous hydrogenated silicon (a-Si:H) TFTs are capable of supplying sufficiently high current to achieve required display brightness and thus can be a cost-effective solution for active matrix OLED displays.

The silicon nitride films used to produce the fabricated TFT samples were amorphous silicon nitride deposited at 120° C. by PECVD from $SiH_4$ and $NH_3$ gaseous precursors. The film is said to have a lower mass density and higher hydrogen concentration in comparison with films fabricated at 260° C. to 320° C. In the study, a series of a-SiN:H films with [N]/[Si] ratio ranging from 1.4 to 1.7 were deposited at 120° C. The hydrogen content in the films was in the range of 25-40 atomic %. Generally, the films with higher [N]/[Si] are said to have higher mass density and higher compressive stress. The resistivity of a-$SiN_x$:H films estimated at the field of 1 MV/cm was said to be in the range of $10^{14}$-$10^{16}$ Ohm·cm, and the films with higher [N]/[Si] were said to have a higher breakdown field and dielectric constant than their lower N-content counterparts. A table of data supporting these conclusions is presented.

Compared to higher temperature counterparts, the lower temperature a-$SiN_x$ films are characterized by higher hydrogen content. The N-rich films with a hydrogen concentration of about 40% or more exhibit hydrogen bonded predominantly to N atoms, with a high [N]/[Si] ratio achieved solely due to the high concentration of N—H bonds. The TFTs produced on a plastic film substrate at lower temperatures require a higher threshold voltage (4-5 V) than the TFTs produced on glass at the higher temperatures. As a result, the ON current observed for TFTs produced at the lower temperatures is lower. Although the performance properties of these TFTs complies with the requirements for OLED applications, it is apparent that it would be beneficial to lower the threshold voltage of the TFTs produced at the 120° C. temperature.

As indicated above, the performance capabilities of the TFT are a direct result of the structural characteristics of the films formed during fabrication of the TFTs. The structural characteristics of the films depend directly upon the process conditions and relative amounts of precursors which are used during formation of the films which make up the TFTs. As the size of flat panel displays increase, it becomes increasingly difficult to control the uniformity of the individual films produced across the increased surface area. With respect to PECVD deposited silicon-nitride comprising films, which are used either as the gate dielectric layer or as the passivation dielectric layer, control of uniformity of the film across the substrate becomes particularly difficult when the PECVD is carried out in a process chamber having parallel-plate, capacitively coupled electrodes over about 1 m×1 m. At the higher RF power applications, the RF power appears to concentrate at the center of the electrode area, resulting in a dome-shaped thickness profile, and film properties are indicative of the non-uniform power distribution across the electrodes. This kind of phenomena is more pronounced at the higher RF power which is used to obtain film deposition rates (D/R) which are in excess of about 1000 Å/min.

Conventional PECVD processes for producing a-SiN$_x$:H employ a precursor gas mixture which is highly diluted with nitrogen (N$_2$) to obtain desired film properties. Such desired film properties are: a compressive film stress in the range of about 0 to 1×10$^{10}$ dynes/cm$^2$; low Si—H content of typically less than about 15 atomic %; and a low wet etch rate in HF solution (WER) of less than about 800 Å/min (normalized to thermal oxide at 1000 Å/min). However, a plasma produced at high concentrations of N$_2$ (where N$_2$:SiH$_4$ is greater than 2:1) in the precursor gas produces a particularly non-uniform plasma over a large surface area, for example, a substrate having dimensions larger than about 1000 mm×1000 mm (one square meter). This is believed to be due to the higher energy required to achieve dissociation of N$_2$ molecules. To overcome this problem with respect to the production of flat panel displays having large surface areas, the N$_2$ precursor gas was replaced by NH$_3$ precursor gas, which dissociates more easily.

More recently, there has been increased demand for even larger flat panel displays, for example those with substrates having dimensions larger than about 1500 mm×1800 mm. Initial efforts to produce flat panel displays of this size using a NH$_3$ precursor to supply nitrogen during formation of the a-SiN$_x$:H gate dielectric films resulted in the formation of a-SiN$_x$:H films exhibiting a higher hydrogen content in the film. As discussed above, this higher hydrogen content leads to a higher threshold voltage requirement for the TFT, which is harmful to performance of the TFT. There is presently a need for a process which permits formation of the a-SiN$_x$:H gate dielectric films over large surface area substrates, where the density of the deposited film is consistent across the substrate surface.

Commonly owned, copending U.S. application Ser. No. 10/829,016 ("the '016 application"), filed on Apr. 30, 2004, and entitled "Controlling the Properties and Uniformity of a Silicon Nitride Film by Controlling the Film Forming Precursors", discloses a method of PECVD depositing an a-SiN$_x$:H dielectric film useful in a TFT device as a gate dielectric, when a series of TFT devices are arrayed over a substrate having a surface area larger than about 1 m$^2$. The method comprises: depositing an a-SiN$_x$:H dielectric film over a substrate which is at a temperature ranging from about 120° C. to about 340° C., at a process chamber pressure which ranges between about 1.0 Torr to about 2.0 Torr, where the a-SiN$_x$:H is deposited from precursors including N$_2$, NH$_3$, and SiH$_4$, and where a component ratio of NH$_3$:SiH$_4$ ranges from about 5.3 to about 10.0, a component ratio of N$_2$:SiH$_4$ ranges from about 5.5 to about 18.7, and a component ratio of N$_2$:NH$_3$ ranges from about 0.6 to about 2.3. A plasma is applied to a mixture of the precursors, so that the plasma density in a process chamber in which the a-SiN$_x$:H dielectric film is deposited ranges between about 0.2 W/cm$^2$ and about 0.6 W/cm$^2$. The film deposition rate is typically more than 1000 Å/min; the Si—H bonded content of the a-SiN$_x$:H film is less than about 15 atomic %; the film stress ranges from about 0 to about −10$^{10}$ dynes/cm$^2$; the film thickness across the substrate surface area varies by less than about 17%; and, the refractive index (RI) of the film ranges from about 1.85 to about 1.95.

SUMMARY OF THE INVENTION

We have discovered that adding H$_2$ to a precursor gas composition including SiH$_4$, NH$_3$, and N$_2$ is effective in improving the wet etch rate and wet etch rate uniformity of a-SiN$_x$:H films across a substrate surface upon which said films have been PECVD deposited. As mentioned above, wet etch rate is an indication of film density. Typically, the lower the wet etch rate, the denser the film. The addition of H$_2$ to the SiH$_4$/NH$_3$/N$_2$ precursor gas composition results in greater control over the density uniformity of PECVD deposited a-SiN$_x$:H films than was previously achievable using prior art precursor gas compositions.

In particular, a-SiN$_x$:H films deposited according to the present method typically have wet etch rates in HF solution in the range of about 300 Å/min to about 800 Å/min, with a variation in wet etch rate that is typically less than about 15% across the substrate surface. The HF solution is one referred to in the industry as "Buffer Oxide Etchant 6:1", which contains 7% by weight hydrofluoric acid, 34% by weight ammonium fluoride, and 59% by weight water. The wet etching test is carried out at a substrate temperature of about 25° C.

We also discovered that the addition of H$_2$ to the film-forming precursor gas composition did not significantly increase the variation in deposited film thickness across the surface of the substrate. Variation in film thickness across the substrate surface for a-SiN$_x$:H deposited according to the present method is typically less than about 20%. Film thickness variations as low as about 15%, have also been achieved using the a-SiN$_x$:H film deposition method described herein.

H$_2$ is provided to the deposition chamber in an amount such that a component ratio of NH$_3$:H$_2$ in the plasma precursor gas composition ranges from about 1:2 to about 3:1; more typically, from about 1:1 to about 3:1. Adding too much H$_2$ to the precursor gas composition may result in reduced film deposition rates and increased variation in film thickness uniformity.

The combination process parameters required to produce an a-SiN$_x$:H gate dielectric film having a wet etch rate in HF solution in the range of about 300 Å/min to about 800 Å/min and a variation in wet etch rate of less than about 15% across the substrate surface include the following: a substrate temperature during film deposition within the range of about 250° C. to about 450° C., more typically, within the range of about 300° C. to about 400° C., and most typically, within the range of about 320° C. to about 360° C.; a process chamber pressure within the range of about 0.5 Torr to about 3 Torr, and more typically within the range of about 1 Torr to about 1.5 Torr; a plasma density within the range of about 0.1 W/cm$^2$ to about 1 W/cm$^2$; and a plasma precursor gas composition in which the precursors gases include N$_2$, NH$_3$, SiH$_4$, and H$_2$, where the component ratios are: NH$_3$:SiH$_4$ ranging from about 2:1 to about 15:1, N$_2$:SiH$_4$ ranging from about 5:1 to about 25:1, NH$_3$:N$_2$ ranging from about 1:3 to about 2:1, and NH$_3$:H$_2$ ranging from about 1:2 to about 3:1. Films deposited according to the process parameters set forth above typically exhibit an atomic % of Si—H bonded structure (measured at the center of the substrate) of less than about 15%.

The electrode spacing in the PECVD process chamber must be appropriate for the substrate size and to meet film property requirements. When the PECVD processing chamber is a parallel plate processing chamber, such as an AKT™ (Santa Clara, Calif.) PECVD 25KA System (which is described in detail subsequently herein), the electrode spacing should be less than about 1500 mils (1 mil≈0.001 inch), and typically ranges between about 400 mils to about 1000 mils.

The total precursor gas flow rate must be appropriate for the processing volume in the area of the substrate. When the parallel plate plasma processing chamber described above is used, the total precursor gas flow rate should range from about 20,000 sccm to about 80,000 sccm.

One skilled in the art can calculate an equivalent electrode spacing and precursor gas flow rate when the plasma processing chamber is different from the processing chamber specified above.

The refractive index of a-SiN$_x$:H films deposited according to the present method is typically within the range of about 1.85 to about 1.95. Films deposited according to the present method typically exhibit a film stress ranging between $4 \times 10^9$ dynes/cm$^2$ (tensile) and about $-1 \times 10^{10}$ dynes/cm$^2$ (compressive).

The a-SiN$_x$:H film deposition method described herein can be used to deposit a-SiN$_x$:H films for use in any application in which a-SiN$_x$:H films are useful. In particular, the a-SiN$_x$:H films described herein are useful as TFT gate dielectrics over surface areas of 25,000 cm$^2$ (2.5 m$^2$) and larger, where the uniformity of the film density and other important film properties is surprisingly consistent. The uniformity of the film across the substrate enables the production of flat panel displays having surface areas of 40,000 cm$^2$ (4 m$^2$), and possibly even larger. For example, substrates having surface areas up to 90,000 cm$^2$ (9 m$^2$) are contemplated.

DETAILED DESCRIPTION OF EXEMPLARY EMBODIMENTS

As a preface to the detailed description presented below, it should be noted that, as used in this specification and the appended claims, the singular forms "a", "an", and "the" include plural referents, unless the context clearly dictates otherwise.

We have developed a method of PECVD depositing a-SiN$_x$:H films which are useful as gate dielectric layers in TFT devices, when a series of TFT devices are arrayed over a substrate having a surface area larger than about 1000 mm×1000 mm, which may be as large as 1900 mm×2200 mm, and possibly even larger, up to a surface area of 9 m$^2$, for example. The a-SiN$_x$:H films exhibit a uniformity of wet etch rate across the substrate surface, as well as uniformity of other film properties, such as film thickness and chemical composition, which are necessary regardless of the surface area of the substrate, but difficult to produce over large area substrates.

We were surprised to discover that by adding H$_2$ to a precursor gas composition including SiH$_4$, NH$_3$, and N$_2$, the wet etch rate and wet etch rate uniformity of a-SiN$_x$:H films which are deposited by PECVD can be improved. Wet etch rate is an indication of film density. Typically, the lower the wet etch rate, the denser the film. The addition of H$_2$ to the SiH$_4$/NH$_3$/N$_2$ precursor gas composition results in both a higher density a-SiN$_x$:H film and greater control over the density uniformity of PECVD deposited a-SiN$_x$:H films than was previously achievable using prior art precursor gas compositions.

In particular, a-SiN$_x$:H films deposited according to the present method typically have wet etch rates in HF solution in the range of about 300 Å/min to about 800 Å/min, with a variation in wet etch rate that is typically less than about 15% across the substrate surface. The HF solution is one referred to in the industry as "Buffer Oxide Etchant 6:1", which contains 7% by weight hydrofluoric acid, 34% by weight ammonium fluoride, and 59% by weight water. The wet etching test is carried out at a substrate temperature of about 25° C.

We also discovered that the addition of H$_2$ to the film-forming precursor gas composition did not significantly increase the variation in deposited film thickness across the surface of the substrate. H$_2$ is provided to the deposition chamber in an amount such that the ratio of NH$_3$:H$_2$ in the plasma precursor gas composition ranges from about 1:2 to about 3:1; more typically, from about 1:1 to about 3:1.

I. An Apparatus for Practicing the Invention

Figure 2A:
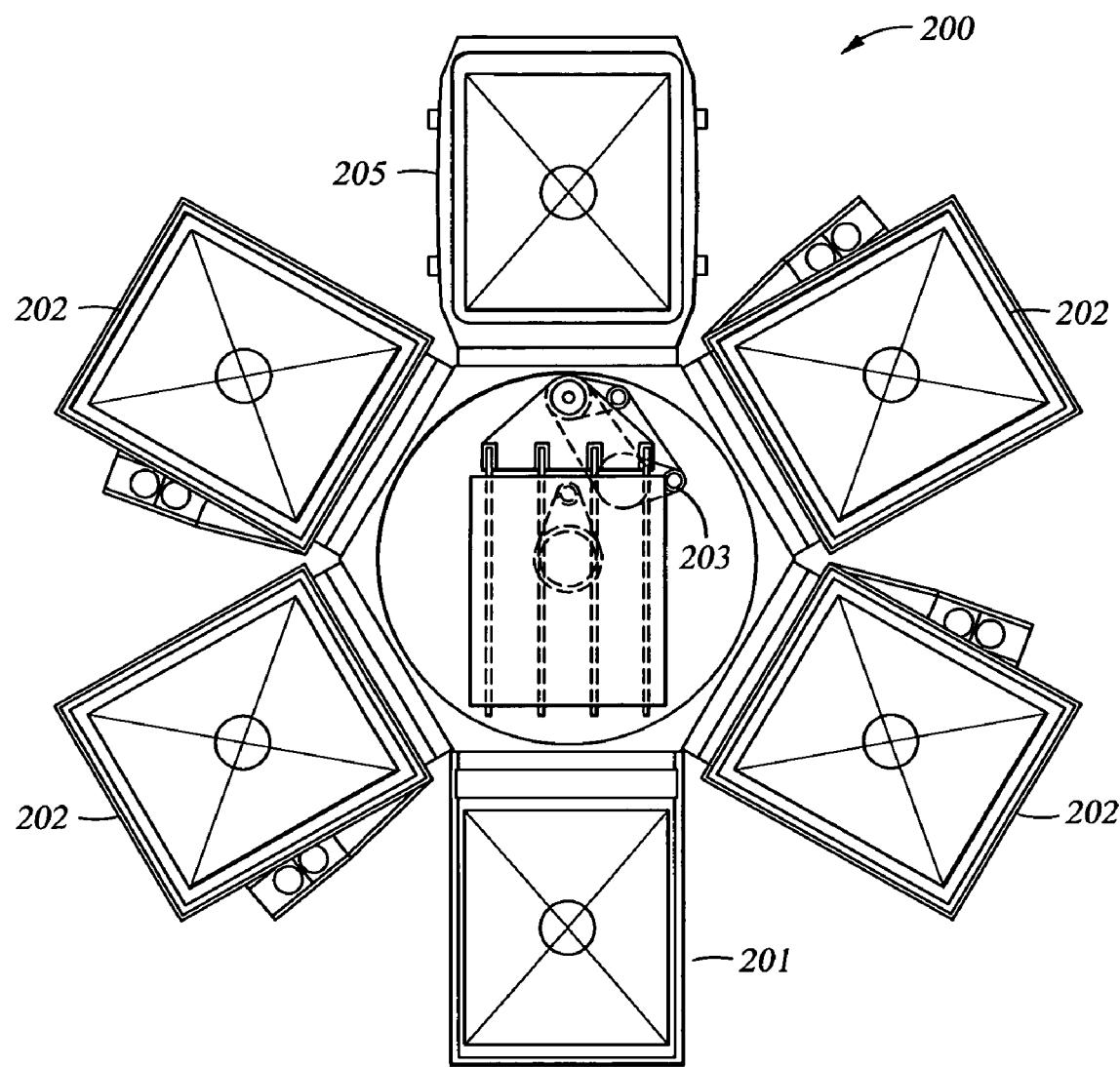
FIG. 2A is a schematic of a top view of a PECVD processing system of the kind which can be used to deposit the films of the present invention.

The embodiment example PECVD processes described herein were carried out in a parallel plate processing chamber, the AKT™ PECVD 25 KA System, available from AKT™, a division of Applied Materials, Inc., Santa Clara, Calif. Referring to FIG. 2A, the system 200 generally includes a loadlock chamber 201 for loading substrates (not shown) into the system; a robot assembly 203 for transferring substrates between chambers in the system; four PECVD processing chambers 202; and an optional substrate heater 205. The AKT™ PECVD 25 KA System is also available with a fifth PECVD processing chamber in place of substrate heater 205.

Figure 2B:
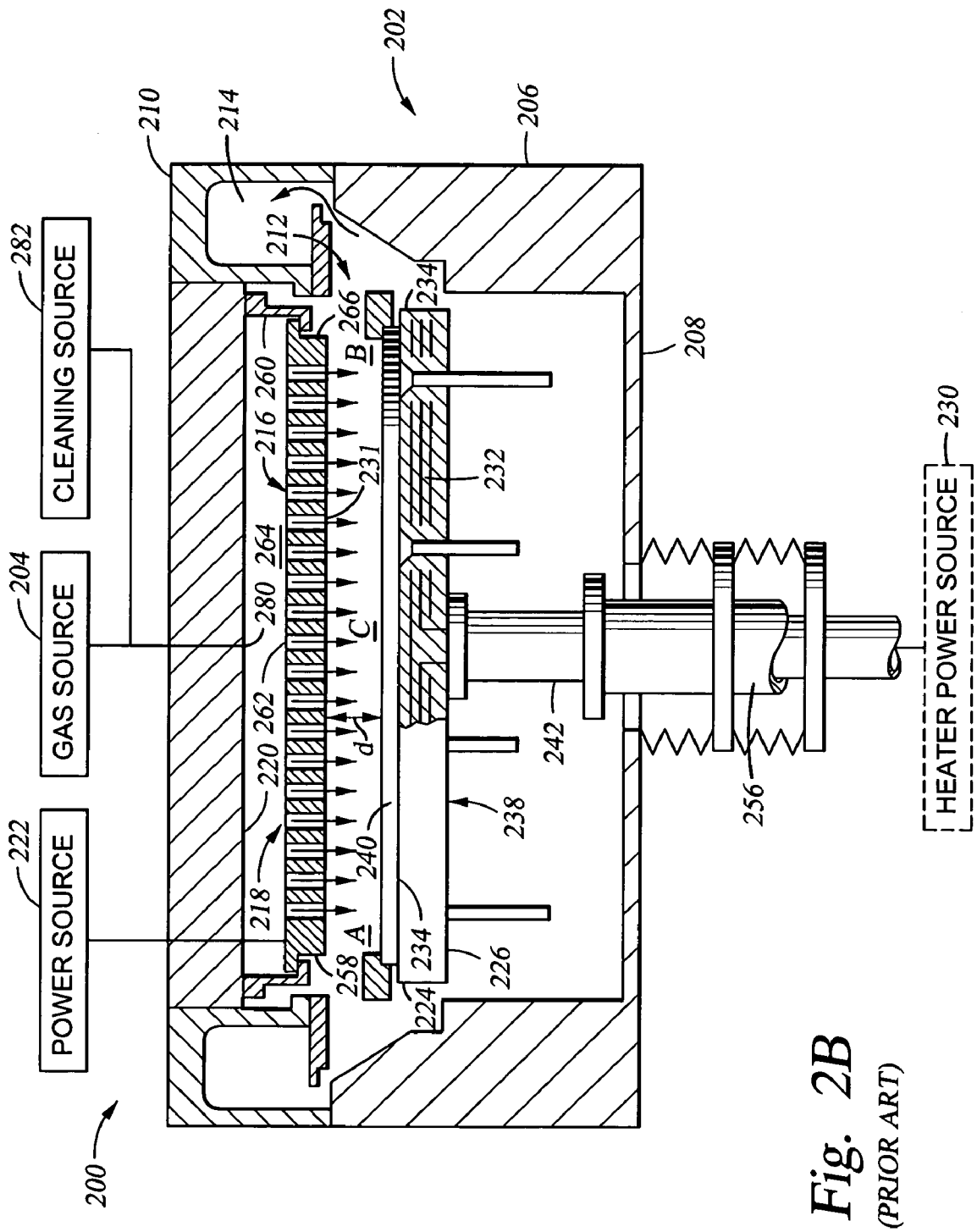
FIG. 2B is a schematic of a side view of a PECVD processing chamber of the kind which can be used to deposit the films of the present invention.

Referring to FIG. 2B, each processing chamber 202 is typically coupled to a gas source 204. The processing chamber 202 has walls 206 and a bottom 208 that partially define a processing volume 212. The processing volume 212 is typically accessed through a port (not shown) in the walls 206 that facilitate movement of a substrate 240 into and out of processing chamber 202. The walls 206 support a lid assembly 210 that contains a pumping plenum 214 that couples the processing volume 212 to an exhaust port (that includes various pumping components, not shown).

A temperature controlled substrate support assembly 238 is centrally disposed within the processing chamber 202. The support assembly 238 supports the glass (for example, but not by way of limitation) substrate 240 during processing. The substrate support assembly 238 typically encapsulates at least one embedded heater 232, such as a resistive element. The heater element 232 is coupled to a power source 230 which is controlled to heat the support assembly 238 and the substrate 240 positioned thereon. Typically, in a CVD process, the heater maintains the substrate 240 at a uniform temperature between about 120° C. and 460° C., depending on the processing parameters required for the particular substrate.

Generally, the support assembly 238 has a lower side 226 and an upper side 234. The upper side 234 supports the glass substrate 240. The lower side 226 has a stem 242 coupled thereto. The stem 242 couples the support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the support assembly 238 and other components of the system 200.

The support assembly 238 is generally grounded such that RF power supplied by a power source 222 to a gas distribution plate assembly 218 positioned between the lid assembly 210 and the substrate support assembly 238 (or other electrode positioned within or near the lid assembly of the chamber) may excite gases present in the processing volume 212 between the support assembly 238 and the distribution plate assembly 218. The RF power from the power source 222 is generally selected commensurate with the size of the substrate, to drive the chemical vapor deposition process. The distance "d" illustrates the spacing between the upper surface 234 of substrate support assembly 238 and the lower surface 231 of distribution plate assembly 218. The spacing "d", in combination with the thickness of the substrate 240, substantially determines the processing volume 212. The spacing "d" can be adjusted as necessary to provide the desired processing conditions.

The lid assembly 210 typically includes an entry port 280 through which process gases provided by the gas source 204 are introduced into processing chamber 202. The entry port 280 is also coupled to a cleaning source 282. The cleaning source 282 typically provides a cleaning agent, such as disassociated fluorine, that is introduced into the processing chamber 202 to remove deposition by-products and films from processing chamber hardware.

The gas distribution plate assembly 218 is coupled to an interior side 220 of the lid assembly 210. The gas distribution plate assembly 218 is typically configured to substantially follow the profile of the substrate 240, for example, polygonal for large area substrates and circular for wafers. The gas distribution plate assembly 218 includes a perforated area 216 through which process and other gases supplied from the gas source 204 are delivered to the processing volume 212. The perforated area 216 of the gas distribution plate assembly 218 is configured to provide uniform distribution of gases passing through the gas distribution plate assembly 218 into the processing chamber 202.

The gas distribution plate assembly 218 typically includes a diffuser plate 258 suspended from a hanger plate 260. The diffuser plate 258 and hanger plate 260 may alternatively comprise a single unitary member. A plurality of gas passages 262 are formed through the diffuser plate 258 to allow a predetermined distribution of a precursor source gas passing through the gas distribution plate assembly 218 and into the processing volume 212. The hanger plate 260 maintains the diffuser plate 258 and the interior surface 220 of the lid assembly in a spaced-apart relation, thus defining a plenum 264 therebetween. The plenum 264 allows gases flowing through the lid assembly 210 to uniformly distribute across the width of the diffuser plate 258 so that gas is provided uniformly above the center perforated area 216 and flows with a uniform distribution through gas passages 262.

II. EXAMPLES

Example One

The Overall Process for Forming a TFT

Figure 1:
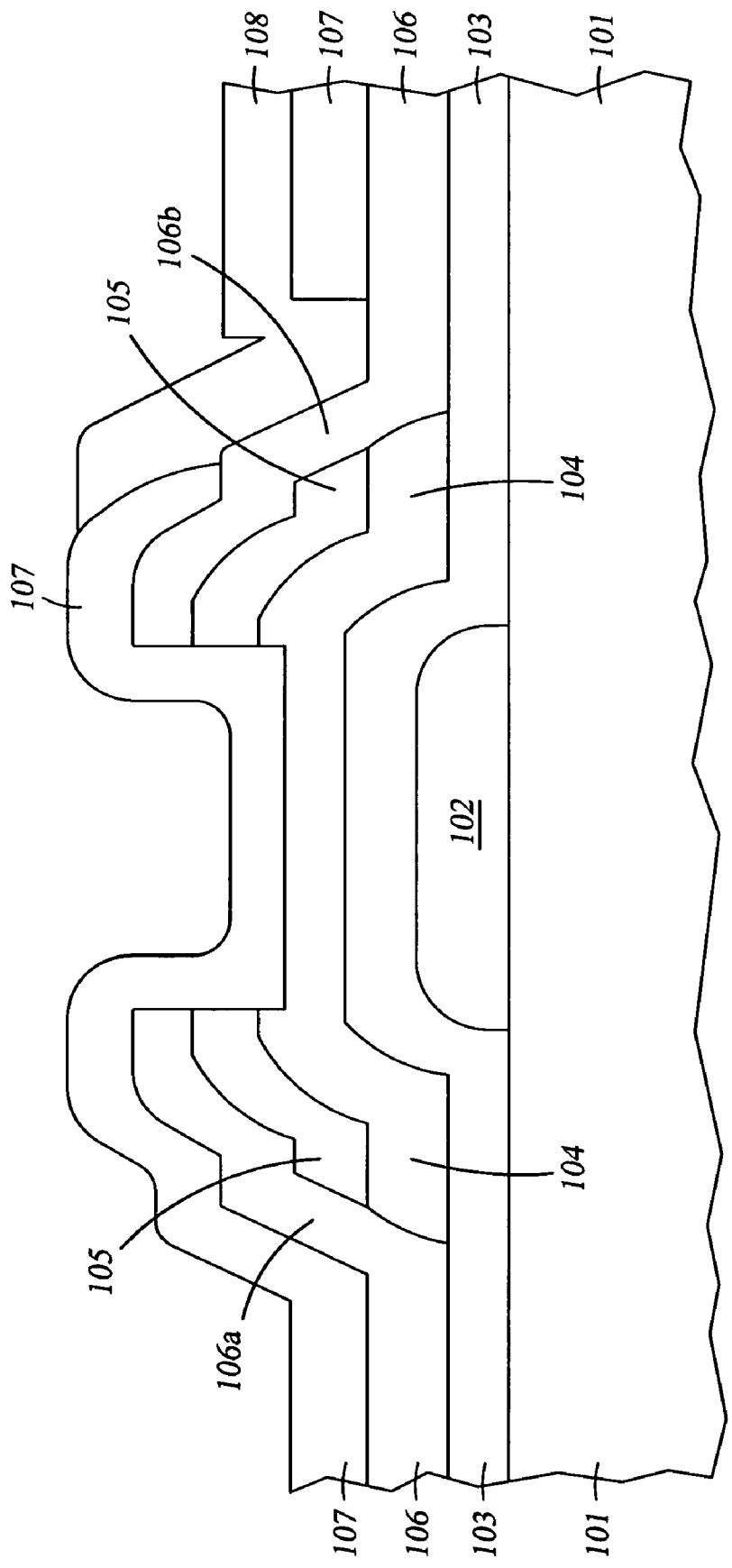
FIG. 1 shows a schematic cross-sectional view of one embodiment of a TFT device of the kind which employs the a-SiN$_x$:H gate and passivation dielectric films of the present invention.

To provide a general understanding of the relationship of the PECVD deposited a-SiN$_x$:H gate dielectric film and the a-SiN$_x$:H passivation dielectric film relative to the other components of the TFT, a brief description of the overall fabrication process of the TFT embodiment shown in FIG. 1 is presented below.

Figure 3A:
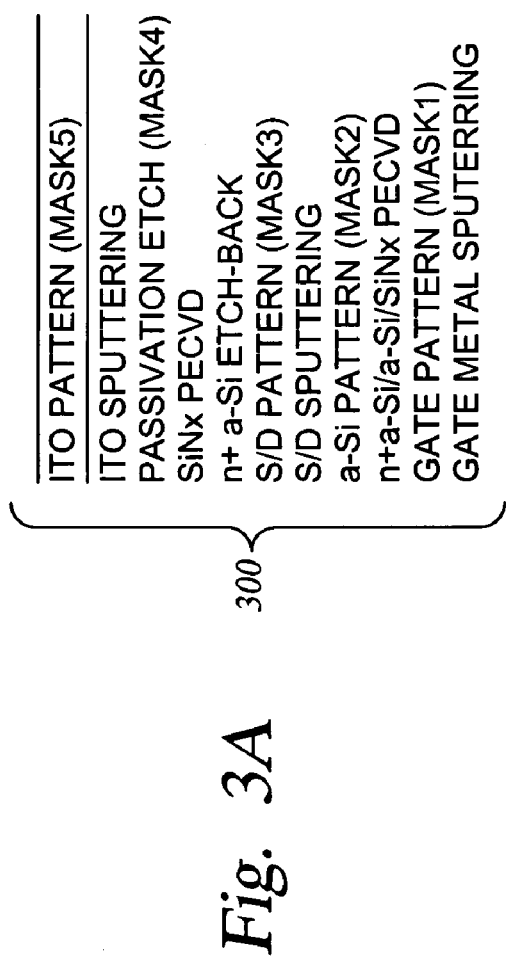
FIG. 3A shows a listing of all the steps which typically would be used to form a TFT structure of the kind shown in FIG. 3B.
Figure 3B:
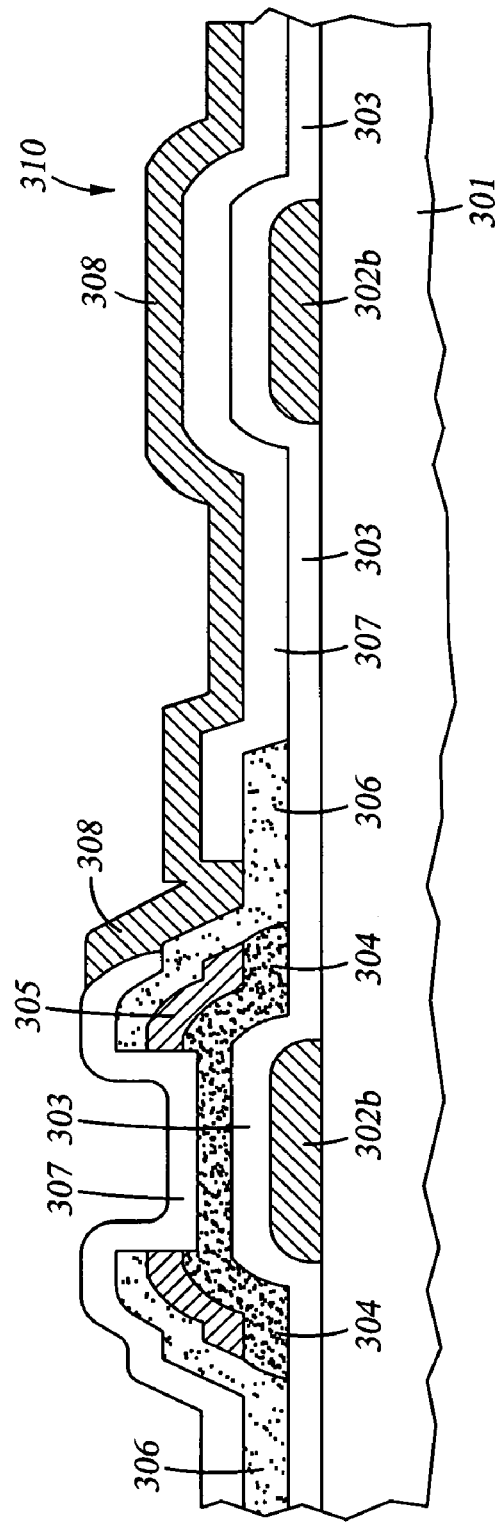
FIG. 3B shows a schematic side view of a substrate including a TFT structure.

FIG. 3A shows a series of process steps 300 which may be carried out to create the TFT device shown in FIG. 3B. FIG. 3B provides a schematic side view of a substrate including a TFT structure.

In the first step, "Gate Metal Sputtering", a conductive layer 302 is sputter deposited over a glass substrate 301 using techniques known in the art. In this particular instance, the substrate 301 is a glass substrate having a thickness of 0.7 mm. The conductive layer 302 is actually a bilayer, where the bottom portion of the layer is a chrome layer, with an overlying layer of an aluminum neodymium alloy.

In the second step, "Gate Pattern (MASK 1)", the conductive layer 302 is pattern etched using a wet etch process known in the art to provide conductive electrodes 302b.

In the third step, "n$^+$ a-Si/a-Si/a-SiN$_x$:H PECVD", a layer 303 of a -SiN$_x$:H is blanket applied by the PECVD process of the present invention, which is described in detail subsequently herein. Following the deposition of layer 303, a layer 304 of a-Si is blanket deposited using a PECVD process which is known in the art. Finally, a layer 305 of n+ doped a-Si is blanket applied by processes known in the art, including a PECVD process, to provide a conductive layer which can later become the source and drain regions for the TFT device.

In the fourth step, "a-Si Pattern (MASK 2)", layers 304 of a-Si and 305 of n+ doped a-Si are pattern dry etched, using techniques known in the art.

In the fifth step in the process, "S/D Sputtering", a blanket sputtering deposition of a chrome layer 306 is carried out using techniques known in the art. A portion of the chrome layer 306 subsequently becomes part of the source and drain regions of the TFT device.

In the sixth step, "S/D Pattern (MASK 3)", chrome layer 306 is pattern dry etched, using techniques known in the art.

In the seventh step in the process, "n$^+$ a-Si Etch-Back", the portion of the n$^+$ a-Si layer 305 which was exposed by the patterned dry etch in the sixth step is etched back using techniques known in the art. N$^+$ a-Si layer 305 is etched completely through, and is "overetched" into underlying layer 304 of a-Si.

In the eighth step in the process, "SiN$_x$:H PECVD", a passivation layer of a-SiN$_x$:H dielectric 307 is applied over the substrate surface using PECVD, according to the method of the present invention.

In the ninth process step, "Passivation Etch (MASK 4)", the passivation layer of a-SiN$_x$:H dielectric 307 is pattern dry etched, using techniques known in the art.

In the tenth process step, "ITO Sputtering", a layer 308 of indium tin oxide is blanket sputter deposited over the substrate using techniques known in the art. The indium tin oxide layer 308 is a conductive optically clear layer when sputter deposited. This optically clear conductive layer enables the use of the TFT device for display applications.

In the eleventh process step, "ITO Pattern (MASK 5)", the indium tin oxide layer 308 is pattern dry etched, using techniques known in the art, to produce a patterned conductive layer which permits addressing of individual TFT structures.

Example Two

The Process for Depositing an a-SiN$_x$:H Gate Dielectric Layer

We have previously described all of the performance requirements for the a-SiN$_x$:H gate dielectric layer. We carried out extensive experimentation in an effort to produce a PECVD deposited a-SiN$_x$:H gate dielectric layer which met the performance requirements, and which provided uniformity in terms of film thickness and film properties, including structural and chemical composition, when the gate dielectric layer is PECVD deposited over a large substrate surface area (larger than 1000 mm×1000 mm, for example).

The basic requirements for the a-SiN$_x$:H film are that: the Si—H bonded content of the a-SiN$_x$:H film is less than about 15 atomic %; the film stress ranges from 0 to about $-10^{10}$ dynes/cm$^2$; the refractive index (RI) of the film ranges from about 1.85 to about 1.95; and the wet etch rate in HF solution (Buffer Oxide Etchant 6:1) is less than 800 Å/min. In addition, the chemical composition of the film, in terms of Si—H bonded content, is preferably consistently below the 15 atomic % maximum.

In an alternative embodiment structure to that shown in FIG. 1, it is possible to deposit the a-SiN$_x$:H gate dielectric layer at a high deposition rate initially (higher than about 1300 Å/min), where the Si—H bonded content may be as high as about 20 atomic %, and then to deposit the a-SiN$_x$:H gate dielectric layer at a low deposition rate (lower than about 1300 Å/min, and typically lower than 1000 Å/min), where the Si—H bonded content is below the 15 atomic % preferred maximum. This provides a good interface between the between the a-Si layer which is subsequently deposited over the a-SiN$_x$:H gate dielectric layer. The film thickness uniformity across the substrate surface area should vary by less than about 20%; preferably, less than about 17%. With respect to uniformity of chemical composition of the film across the substrate, it is preferred that the S—H bonded structure not vary by more than 4 atomic %. With respect to uniformity of other film properties across the wafer, it is preferred that the variation in stress be less than about $4\times10^9$, and that the wet etch rate (WER), which is also an indication of density, not vary more than about 100 Å/min over the entire surface of the substrate.

Tables One and Two, below, present process conditions for PECVD deposition of a-SiN$_x$:H films according to the present method. No H$_2$ was added to the precursor gas composition in Runs # 1, 3, 8, and 10, which are provided as controls. Run # 2 was performed under identical processing conditions as Run # 1, with the addition of 15,000 sccm H$_2$ to the precursor gas composition. Run # 4 was performed under identical processing conditions as Run # 3, with the addition of 15,000 sccm H$_2$ to the precursor gas composition. Run # 9 was performed under identical processing conditions as Run # 8, with the addition of 10,000 sccm H$_2$ to the precursor gas composition. Run # 11 was performed under identical processing conditions as Run # 10, with the addition of 15,000 sccm H$_2$ to the precursor gas composition. All of the runs were carried out in an AKT™ 25 KA PECVD System of the kind previously described herein.

TABLE ONE

Process Conditions for PECVD Deposition of a-SiN$_x$:H Gate Dielectric Films: Deposition Runs # 1-6

| | Run #: | | | | | |
|---|---|---|---|---|---|---|
| | 1 | 2 | 3 | 4 | 5 | 6 |
| SiH$_4$ Flow (sccm) | 4000 | 4000 | 3500 | 3500 | 3500 | 3500 |
| NH$_3$ Flow (sccm) | 29,000 | 29,000 | 29,000 | 29,000 | 24,000 | 34,000 |
| N$_2$ Flow (sccm) | 25,000 | 25,000 | 22,000 | 22,000 | 27,000 | 22,000 |
| H$_2$ Flow (sccm) | 0 | 15,000 | 0 | 15,000 | 15,000 | 15,000 |
| Total Gas Flow Rate (sccm) | 58,000 | 73,000 | 54,500 | 69,500 | 69,500 | 74,500 |
| RF Power (kW) | 11 | 11 | 11 | 11 | 11 | 11 |
| Chamber Pressure (Torr) | 1.5 | 1.5 | 1.5 | 1.5 | 1.5 | 1.5 |
| Substrate Temperature (° C.) | 335 | 335 | 335 | 335 | 335 | 335 |
| Electrode Spacing (mils) | 800 | 800 | 800 | 800 | 800 | 800 |
| Deposition Rate (Å/min) | 2044 | 1778 | 1884 | 1730 | 1800 | 1787 |
| NH$_3$:SiH$_4$ | 7.2 | 7.2 | 8.3 | 8.3 | 6.9 | 9.7 |
| N$_2$:SiH$_4$ | 6.2 | 6.2 | 6.3 | 6.3 | 7.7 | 6.3 |
| NH$_3$:N$_2$ | 1.2 | 1.2 | 1.3 | 1.3 | 0.89 | 1.5 |
| H$_2$:SiH$_4$ | — | 3.8 | — | 4.3 | 4.3 | 4.3 |
| NH$_3$:H$_2$ | — | 1.9 | — | 1.9 | 1.6 | 2.3 |
| N$_2$:H$_2$ | — | 1.7 | — | 1.5 | 1.8 | 1.5 |
| % vol. H$_2$ | 0 | 20.5 | 0 | 21.6 | 21.6 | 20.1 |

TABLE TWO

Process Conditions for PECVD Deposition of a-SiN$_x$:H Gate Dielectric Films: Deposition Runs # 7-12

| | Run #: | | | | | |
|---|---|---|---|---|---|---|
| | 7 | 8 | 9 | 10 | 11 | 12 |
| SiH$_4$ Flow (sccm) | 3500 | 1000 | 1000 | 1000 | 1000 | 1000 |
| NH$_3$ Flow (sccm) | 29,000 | 10,000 | 10,000 | 10,000 | 10,000 | 10,000 |
| N$_2$ Flow (sccm) | 27,000 | 21,500 | 21,500 | 21,500 | 21,500 | 21,500 |
| H$_2$ Flow (sccm) | 15,000 | 0 | 10,000 | 0 | 10,000 | 15,000 |
| Total Gas Flow Rate (sccm) | 74,500 | 32,500 | 42,500 | 32,500 | 42,500 | 47,500 |
| RF Power (kW) | 11 | 6.5 | 6.5 | 5 | 5 | 6.5 |
| Chamber Pressure (Torr) | 1.5 | 1.5 | 1.5 | 1.5 | 1.5 | 1.5 |
| Substrate Temperature (° C.) | 335 | 335 | 335 | 335 | 335 | 335 |
| Electrode Spacing (mils) | 800 | 600 | 600 | 600 | 600 | 600 |
| Deposition Rate (Å/min) | 1749 | 1001 | 945 | 836 | 797 | 920 |
| NH$_3$:SiH$_4$ | 8.3 | 10 | 10 | 10 | 10 | 10 |
| N$_2$:SiH$_4$ | 7.7 | 21.5 | 21.5 | 21.5 | 21.5 | 21.5 |
| NH$_3$:N$_2$ | 1.1 | 0.47 | 0.47 | 0.47 | 0.47 | 0.47 |
| NH$_3$:H$_2$ | 1.9 | — | 1 | — | 1 | 0.67 |
| H$_2$:SiH$_4$ | 4.3 | — | 10 | — | 10 | 15 |
| N$_2$:H$_2$ | 1.8 | — | 2.2 | — | 2.2 | 1.4 |
| % vol. H$_2$ | 20.1 | 0 | 23.5 | 0 | 23.5 | 31.6 |

Table Three, below, provides deposition and wet etch rate data for Runs # 1-12. Wet etch rates were measured in an HF solution referred to in the industry as "Buffer Oxide Etchant 6:1", which contains 7% by weight hydrofluoric acid, 34% by weight ammonium fluoride, and 59% by weight water. The wet etching tests were carried out at a substrate temperature of about 25° C.

TABLE THREE

Deposition and Wet Etch Rates for PECVD Deposition of a-SiN$_x$:H Gate Dielectric Films: Deposition Runs # 1-12

| | | | Wet Etch Rate (Å/min) | | | |
|---|---|---|---|---|---|---|
| Run # | NH$_3$:H$_2$ | Deposition Rate (Å/min) | Window[1] | Center[2] | Slit Valve[3] | Δ Max.[4] | Δ Max. %[5] |
| 1 | — | 2044 | 1116 | 737 | 1213 | 476 | 64.6 |
| 2 | 1.9 | 1778 | 388 | 333 | 387 | 55 | 16.5 |
| 3 | — | 1884 | 1035 | 696 | 988 | 339 | 48.7 |
| 4 | 1.9 | 1730 | 388 | 391 | 363 | 28 | 7.7 |
| 5 | 1.6 | 1258 | 308 | 287 | 317 | 30 | 10.5 |
| 6 | 2.3 | 1178 | 320 | 282 | 316 | 38 | 13.5 |
| 7 | 1.9 | 1749 | 368 | 334 | 355 | 34 | 10.2 |
| 8 | — | 1001 | 917 | 868 | 1005 | 137 | 15.8 |
| 9 | 1.0 | 945 | 610 | 527 | 617 | 90 | 17.1 |
| 10 | — | 836 | 1062 | 1063 | 1086 | 24 | 2.3 |
| 11 | 1.0 | 797 | 578 | 520 | 596 | 76 | 14.6 |
| 12 | 0.67 | 920 | 507 | 471 | 519 | 48 | 10.2 |

[1] Chamber near window side "A" (see FIG. 2).
[2] Chamber near center "C" (see FIG. 2).
[3] Chamber near slit valve side "B" (see FIG. 2).
[4] Maximum difference.
[5] Maximum difference (%). Δ Max. % = Δ Max. divided by the lowest recorded etch rate value (which was measured at the center of the substrate in all runs except Runs # 4 and # 10).

Addition of H$_2$ to the precursor gas composition resulted in a lowered rate of film deposition, but the decrease was only about 5-13%. However, as evidenced by the wet etch rate data in Table Three, above, the films deposited using a precursor gas composition which included H$_2$ typically exhibited improved wet etch rate uniformities rates than the films which were deposited without H$_2$. In addition, the films deposited using a precursor gas composition which included H$_2$ exhibited wet etch rates which were significantly lower than the films which were deposited without H$_2$. As discussed above, wet etch rate is an indication of film thickness, with lower wet etch rates being associated with denser films.

Figure 4A:
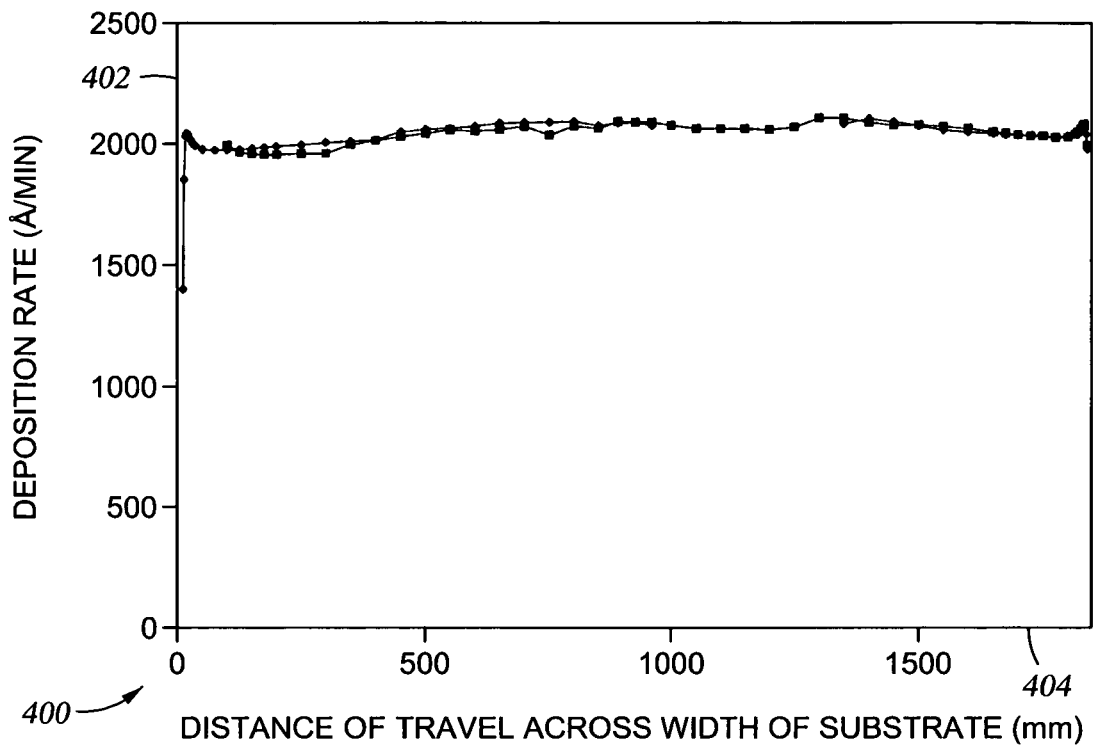
FIGS. 4A-4G are graphs of the film deposition rate (in Å/min) as a function of the distance of travel across the width of the substrate, where the width of the substrate was 1850 mm and the length of the substrate was 1500 mm (for a total substrate area of 27,750 cm$^2$), for a-SiN$_x$:H films which were PECVD deposited in a process chamber having an electrode spacing of 800 mils.
Figure 4B:
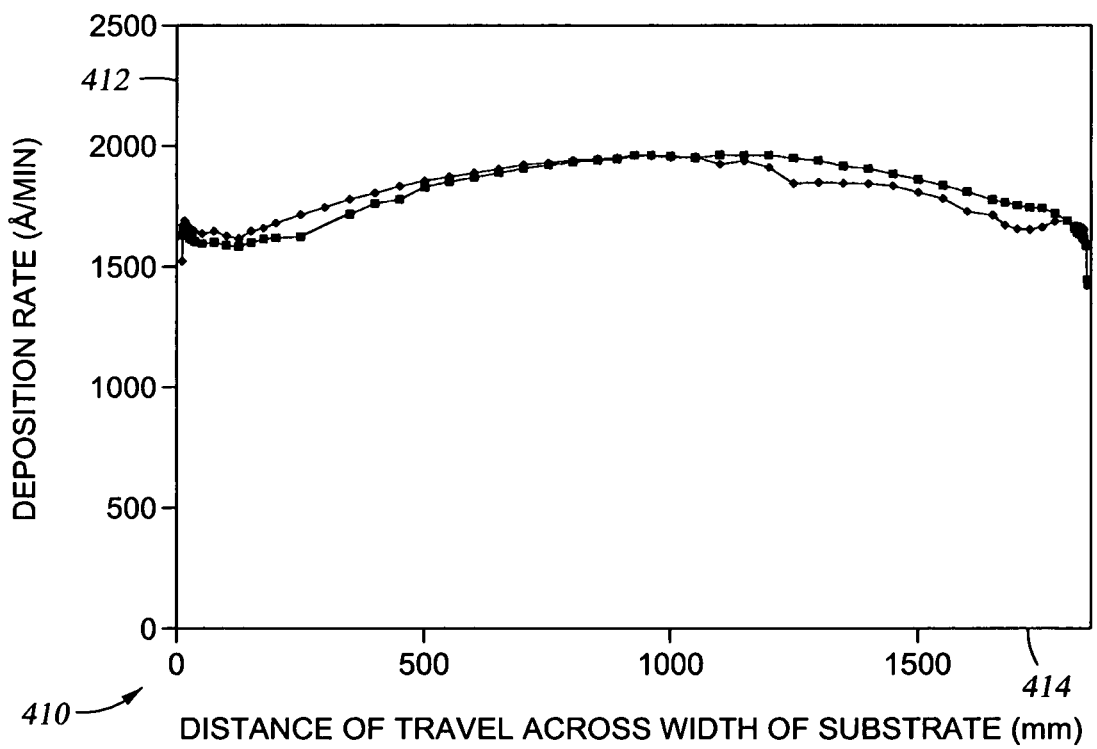
Figure 4C:
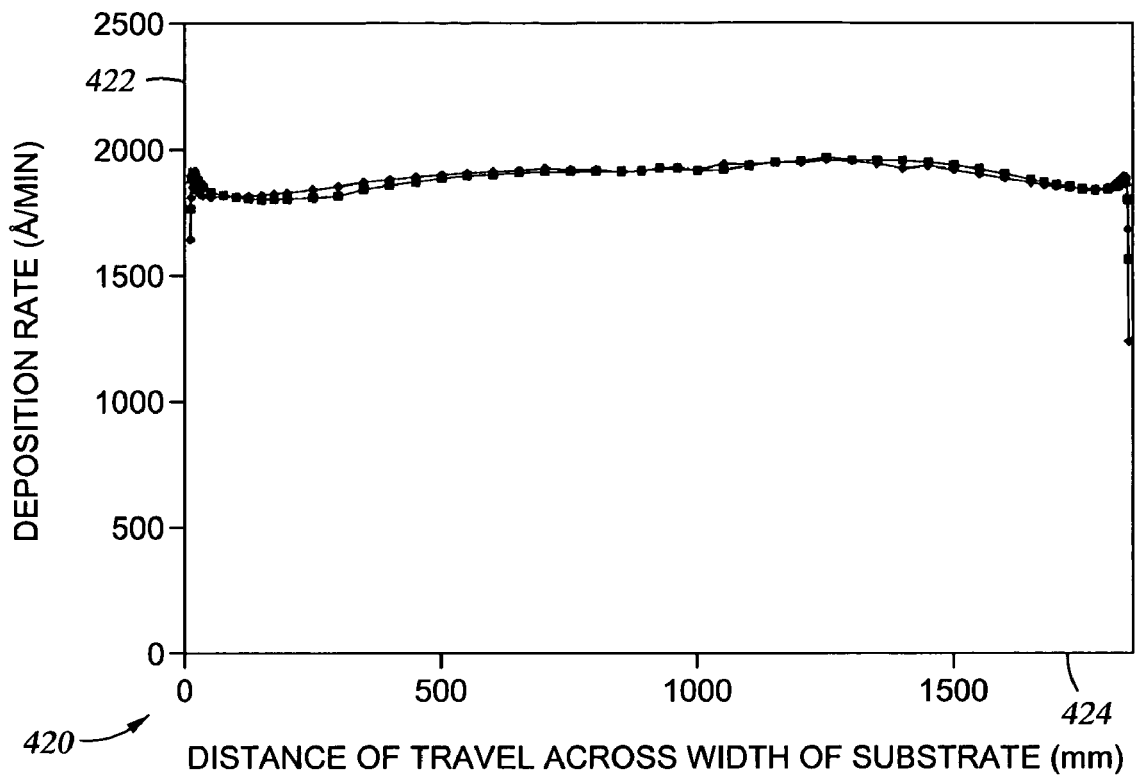
Figure 4D:
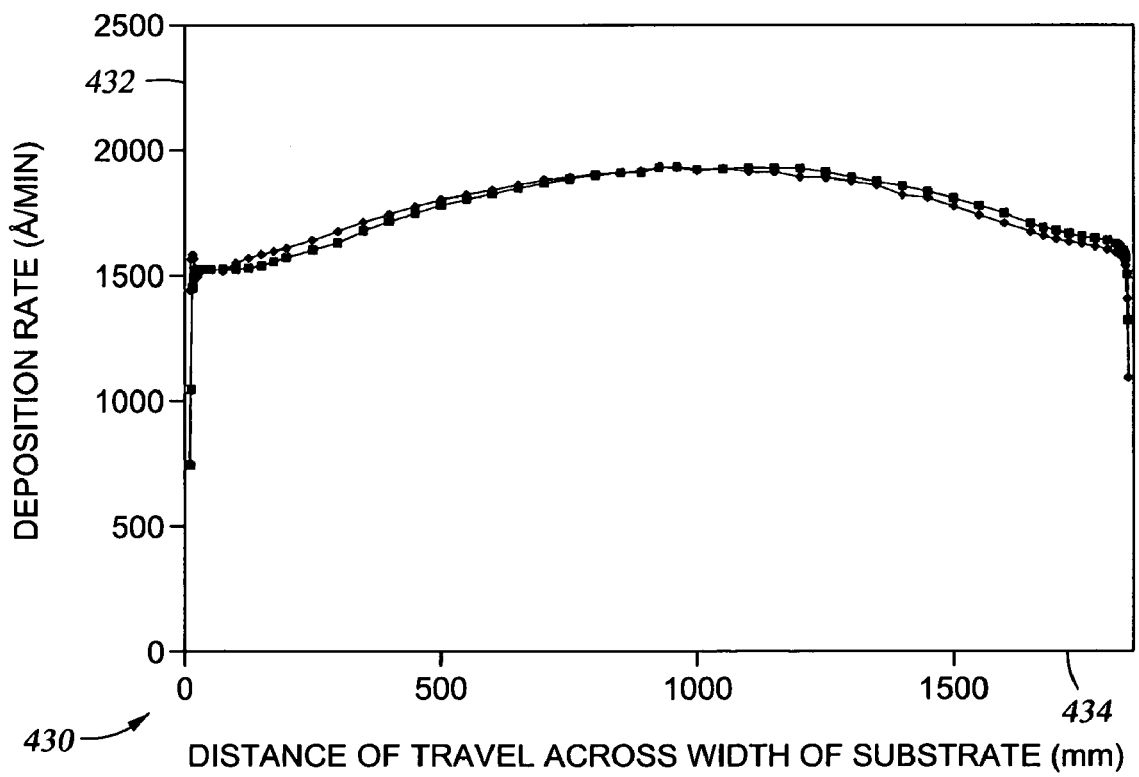
Figure 4E:
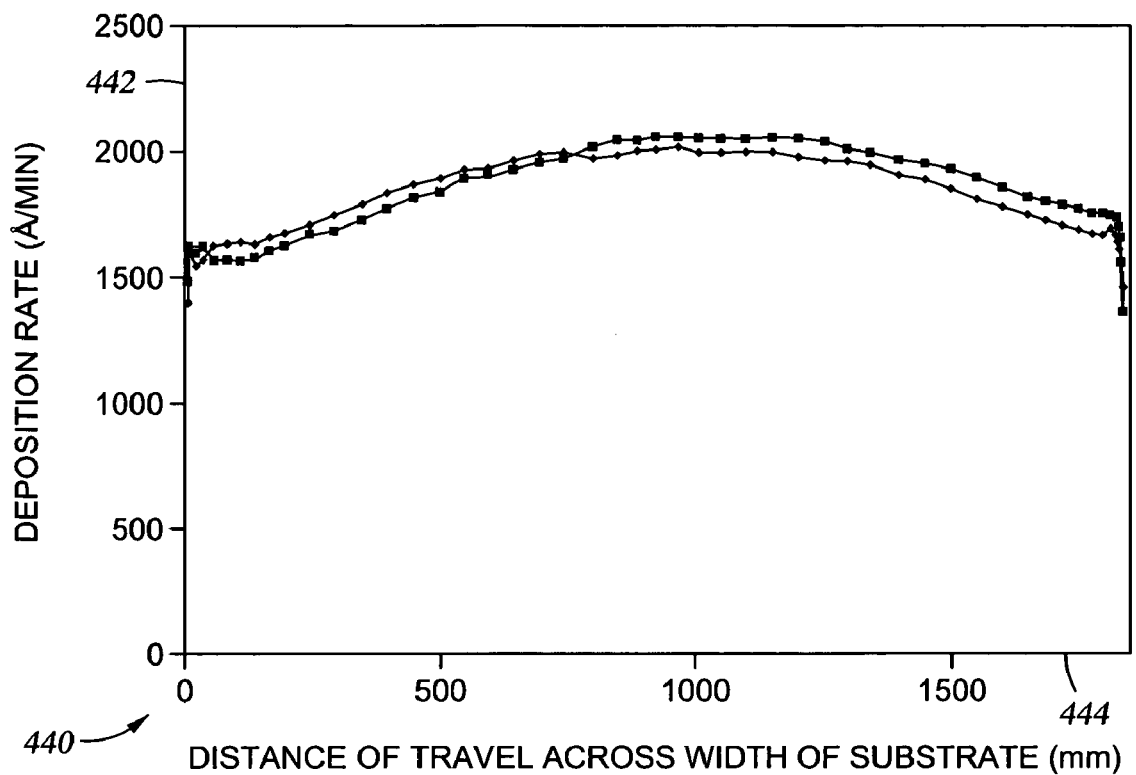
Figure 4F:
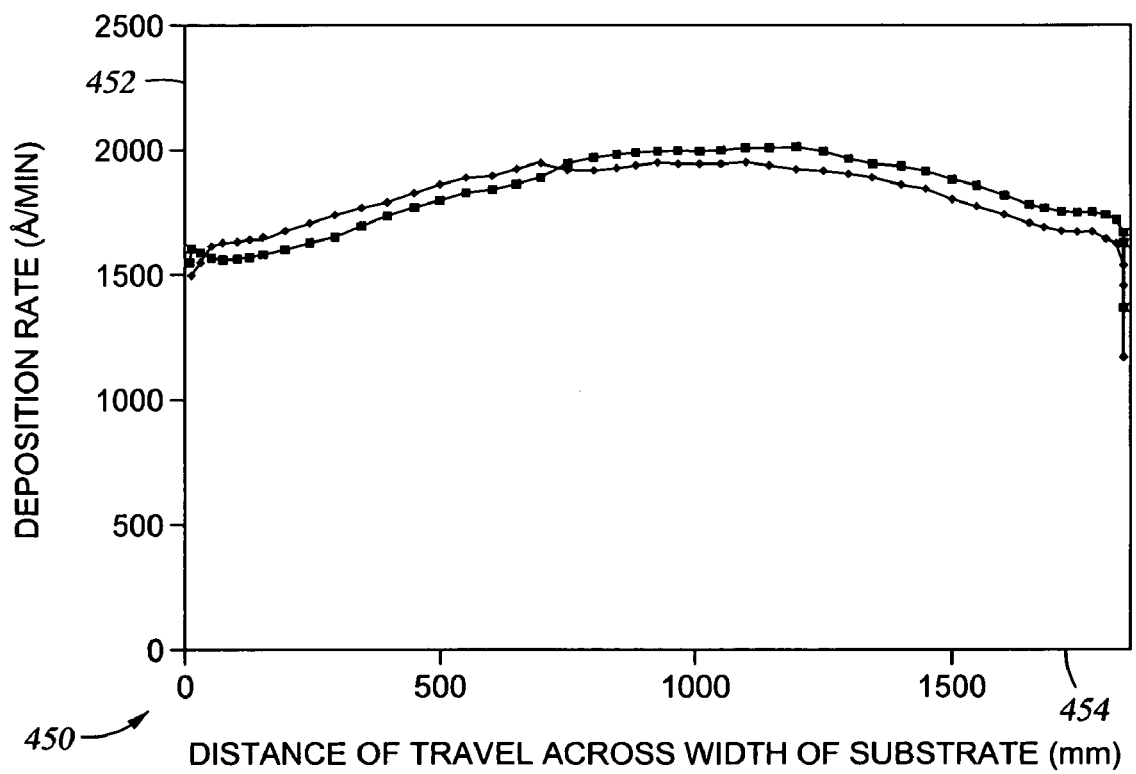
Figure 4G:
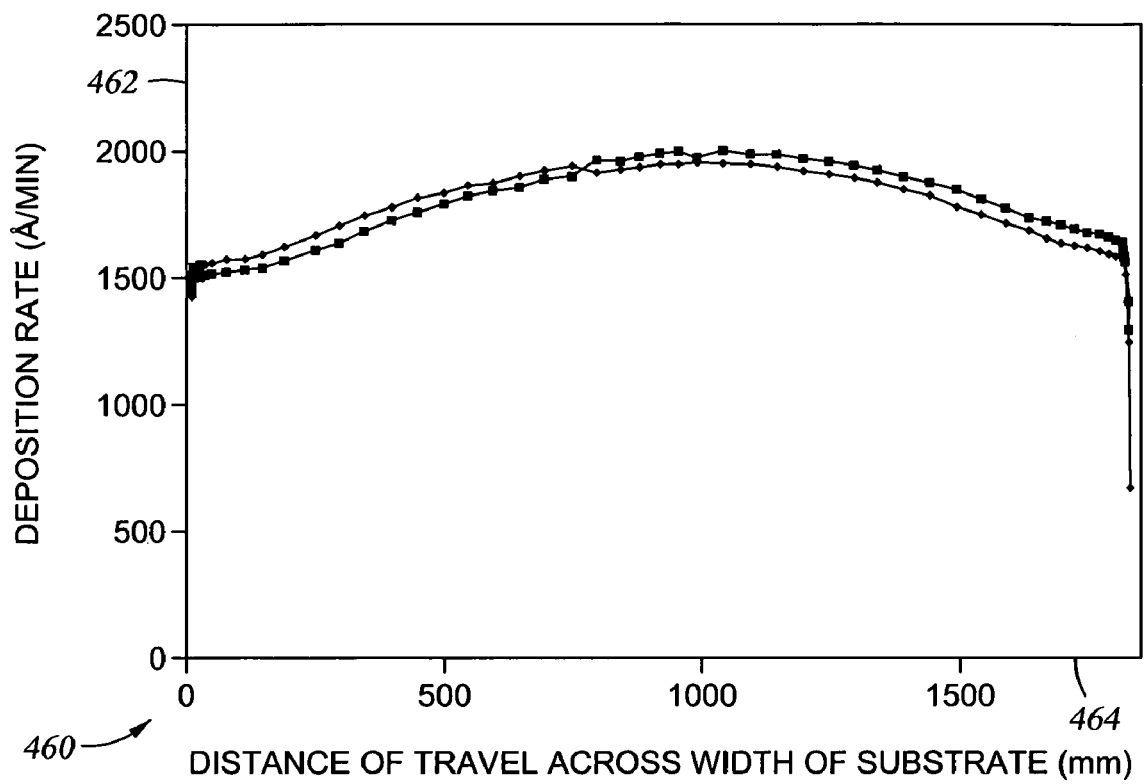

Deposition rate data are presented graphically in FIGS. 4A-4G and 5A-5E. FIGS. 4A-4G are graphs of the film deposition rate as a function of the distance of travel across the width of the substrate, where the width of the substrate was 1850 mm, for a-SiN$_x$:H films which were PECVD deposited in a process chamber having an electrode spacing of 800 mils (Runs # 1-7). FIG. 4A is a graph 400 of the film deposition rate 402 as a function of the distance of travel 404 across the width of the substrate for a-SiN$_x$:H films which were PECVD deposited under the deposition conditions provided in Table One for Run # 1. FIG. 4B is a graph 410 of the film deposition rate 412 as a function of the distance of travel 414 across the width of the substrate for a-SiN$_x$:H films which were PECVD deposited under the deposition conditions provided in Table One for Run # 2. FIG. 4C is a graph 420 of the film deposition rate 422 as a function of the distance of travel 402 across the width of the substrate for a-SiN$_x$:H films which were PECVD deposited under the deposition conditions provided in Table One for Run # 3. FIG. 4D is a graph 430 of the film deposition rate 432 as a function of the distance of travel 434 across the width of the substrate for a-SiN$_x$:H films which were PECVD deposited under the deposition conditions provided in Table One for Run # 4. FIG. 4E is a graph 440 of the film deposition rate 442 as a function of the distance of travel 444 across the width of the substrate for a-SiN$_x$:H films which were PECVD deposited under the deposition conditions provided in Table One for Run # 5. FIG. 4F is a graph 450 of the film deposition rate 452 as a function of the distance of travel 454 across the width of the substrate for a-SiN$_x$:H films which were PECVD deposited under the deposition conditions provided in Table One for Run # 6. FIG. 4G is a graph 460 of the film deposition rate 462 as a function of the distance of travel 464 across the width of the substrate for a-SiN$_x$:H films which were PECVD deposited under the deposition conditions provided in Table Two for Run # 7.

distance of travel 504 across the width of the substrate for a-SiN$_x$:H films which were PECVD deposited under the deposition conditions provided in Table Two for Run # 8. FIG. 5B is a graph 510 of the film deposition rate 512 as a function of the distance of travel 514 across the width of the substrate for a-SiN$_x$:H films which were PECVD deposited under the deposition conditions provided in Table Two for Run # 9. FIG. 5C is a graph 520 of the film deposition rate 522 as a function of the distance of travel 524 across the width of the substrate for a-SiN$_x$:H films which were PECVD deposited under the deposition conditions provided in Table Two for Run # 10. FIG. 5D is a graph 530 of the film deposition rate 532 as a function of the distance of travel 534 across the width of the substrate for a-SiN$_x$:H films which were PECVD deposited under the deposition conditions provided in Table Two for Run # 11. FIG. 5E is a graph 540 of the film deposition rate 542 as a function of the distance of travel 544 across the width of the substrate for a-SiN$_x$:H films which were PECVD deposited under the deposition conditions provided in Table Two for Run # 12.

Figure 5A:
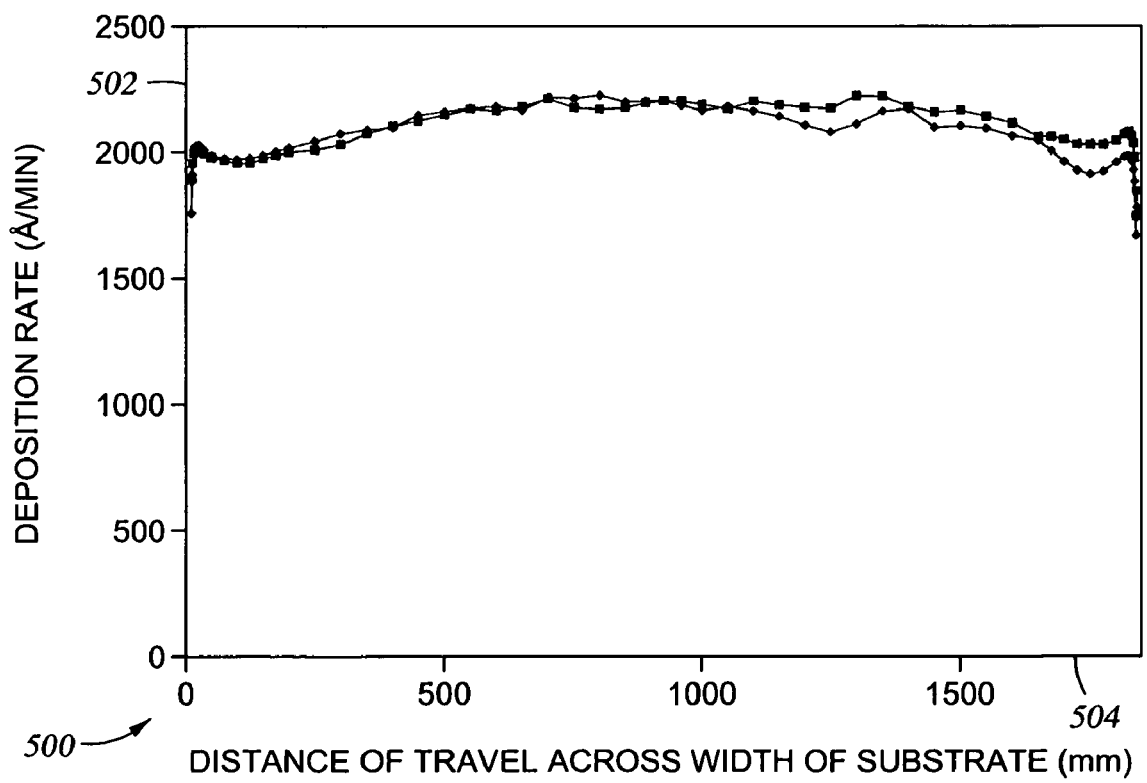
FIGS. 5A-5E are graphs of the film deposition rate (in Å/min) as a function of the distance of travel across the width of the substrate, where the width of the substrate was 1850 mm and the length of the substrate was 1500 mm (for a total substrate area of 27,750 cm$^2$), for a-SiN$_x$:H films which were PECVD deposited in a process chamber having an electrode spacing of 600 mils.
Figure 5B:
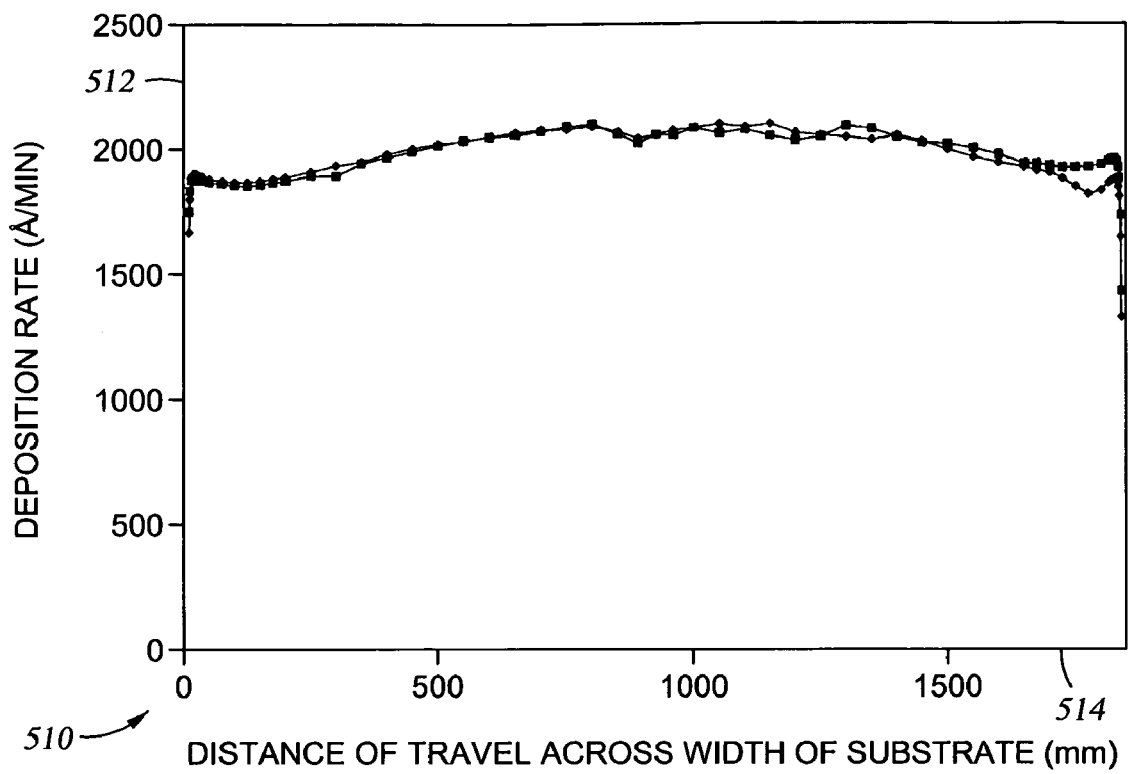
Figure 5C:
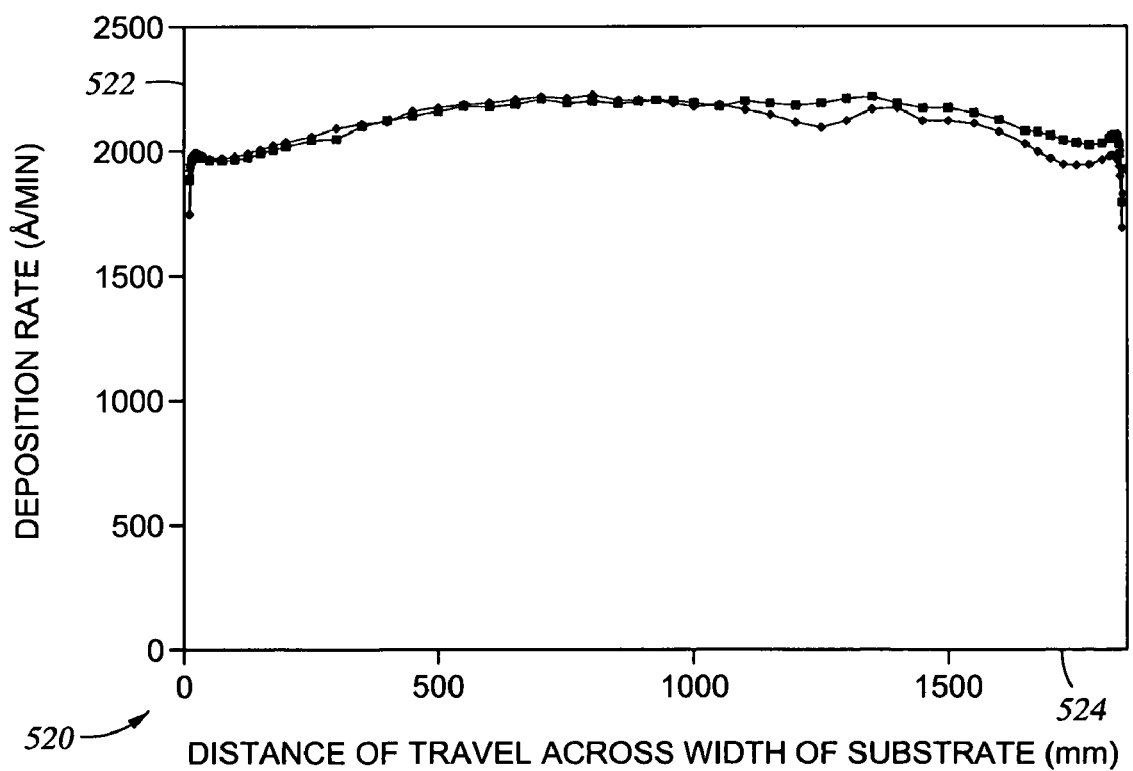
Figure 5D:
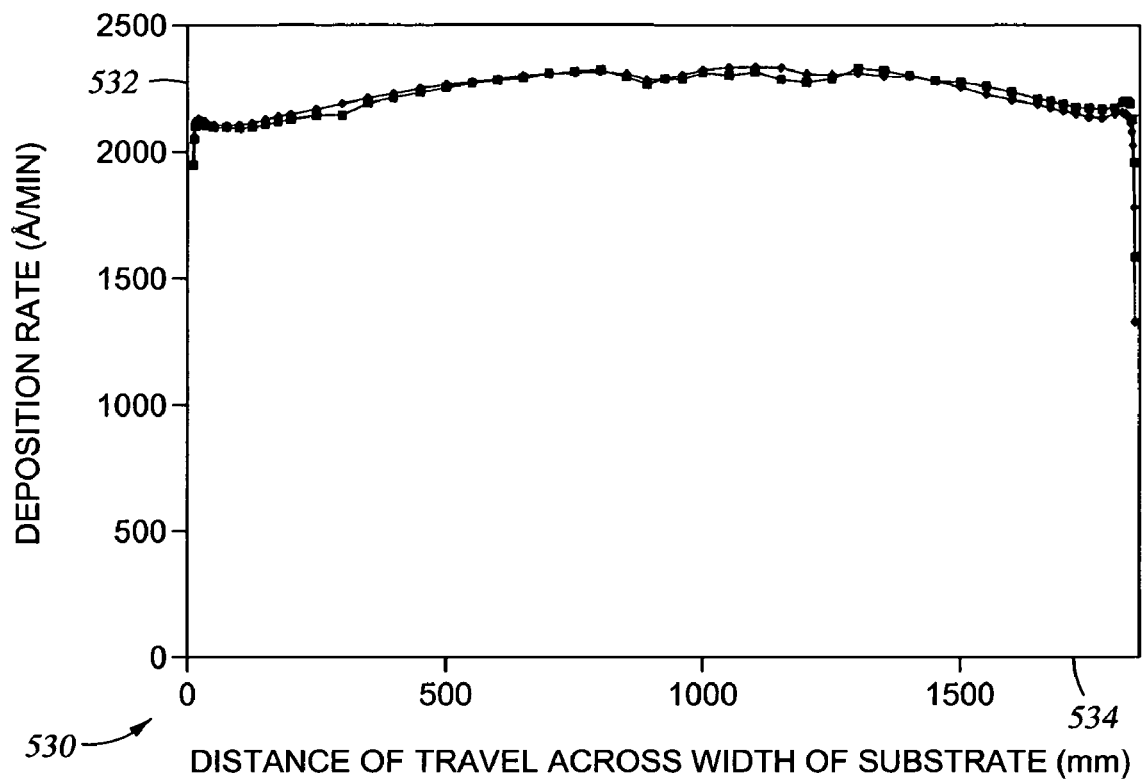
Figure 5E:
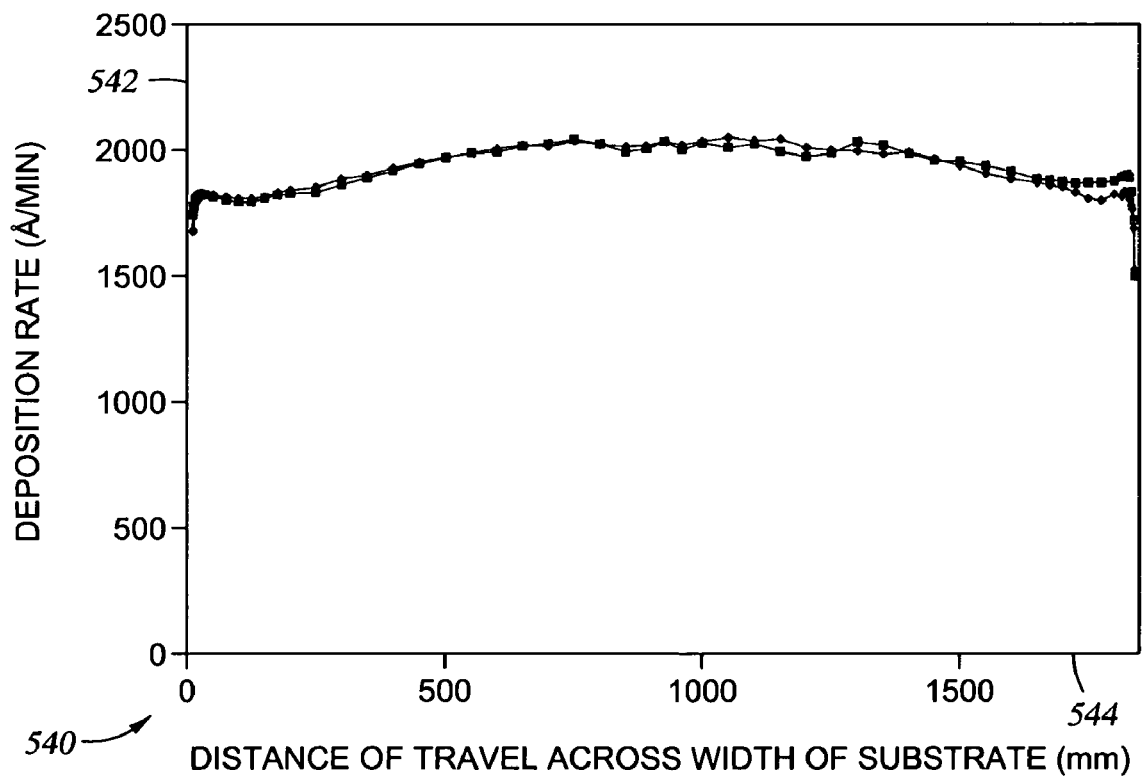

As can be seen by comparing FIG. 4B with FIG. 4A (Run # 2 vs. Run # 1), FIG. 4D with FIG. 4C (Run # 4 vs. Run # 3), FIG. 5B with FIG. 5A (Run # 9 vs. Run # 8), and FIG. 5D with FIG. 5C (Run # 11 vs. Run # 10), addition of H$_2$ to the precursor gas composition slightly increased the variation in the deposition rate over the substrate surface. However, the deposition rate uniformities illustrated in FIGS. 4B (Run # 2), 4D (Run # 4), 5B (Run # 9), and 5D (Run # 11) were still well within the range of acceptability.

Table Four, below, provides N—H and Si—H structural content data for Runs # 1-12.

TABLE FOUR

N—H and Si—H Structural Content for PECVD Deposition of a-SiN$_x$:H Gate Dielectric Films: Deposition Runs # 1-12

| | | N—H (%) | | | | Si—H (%) | | | |
|---|---|---|---|---|---|---|---|---|---|
| Run # | NH$_3$:H$_2$ | Window[1] | Center[2] | Slit Valve[3] | Δ Max.[4] | Window[1] | Center[2] | Slit Valve[3] | Δ Max.[4] |
| 1 | — | 17.9 | 19.1 | 17.5 | 1.6 | 19.0 | 16.4 | 19.0 | 2.6 |
| 2 | 1.9 | 17.7 | 19.6 | 18.0 | 2.2 | 16.6 | 13.5 | 16.4 | 3.1 |
| 3 | — | 18.9 | 20.0 | 21.4 | 2.5 | 17.5 | 14.0 | 20.1 | 6.1 |
| 4 | 1.9 | 19.6 | 21.6 | 20.1 | 2.0 | 13.9 | 10.4 | 13.2 | 3.4 |
| 5 | 1.6 | 18.8 | 21.1 | 19.0 | 2.3 | 15.2 | 11.3 | 14.5 | 3.9 |
| 6 | 2.3 | 18.1 | 20.3 | 18.3 | 2.2 | 16.1 | 12.4 | 15.4 | 3.7 |
| 7 | 1.9 | 20.0 | 22.5 | 20.6 | 2.5 | 13.2 | 9.8 | 13.0 | 3.4 |
| 8 | — | 29.6 | 30.4 | 30.0 | 0.8 | 3.0 | 1.8 | 3.2 | 1.4 |
| 9 | 1.0 | 29.0 | 29.6 | 28.7 | 0.9 | 1.8 | 0.6 | 1.7 | 1.2 |
| 10 | — | 27.6 | 29.3 | 28.9 | 1.7 | 5.4 | 4.1 | 6.1 | 2.0 |
| 11 | 1.0 | 26.8 | 29.2 | 27.9 | 2.4 | 4.2 | 2.4 | 4.2 | 1.8 |
| 12 | 0.67 | 28.5 | 29.2 | 29.8 | 1.3 | 1.5 | 0.3 | 1.7 | 1.4 |

[1] Chamber near window side "A" (see FIG. 2).
[2] Chamber near center "C" (see FIG. 2).
[3] Chamber near slit valve side "B" (see FIG. 2).
[4] Maximum difference.

FIGS. 5A-5E are graphs of the film deposition rate as a function of the distance of travel across the length of the substrate, where the width of the substrate was 1850 mm, for a-SiN$_x$:H films which were PECVD deposited in a process chamber having an electrode spacing of 600 mils. FIG. 5A is a graph 500 of the film deposition rate 502 as a function of the Addition of H$_2$ to the precursor gas composition resulted in a lowered Si—H content of the deposited film. The Si—H content of the deposited film dropped by about 13% to about 67% with the addition of H$_2$ to the precursor gas composition.

Table Five, below, provides film thickness measurement data, including film thickness uniformity, for Runs # 1-12.

TABLE FIVE

Film Thickness Measurements for PECVD Deposition
of a-SiN$_x$:H Gate Dielectric Films: Deposition Runs # 1-12

| | | Film Thickness (Å) | | | | | |
|---|---|---|---|---|---|---|---|
| Run # | NH$_3$:H$_2$ | Window[1] | Center[2] | Slit Valve[3] | Δ Max.[4] | Uniformity - 15[5] | Uniformity - 20[6] |
| 1 | — | 7709 | 7973 | 7920 | 264 | 3.7% | 3.7% |
| 2 | 1.9 | 5336 | 6270 | 5435 | 934 | 10.7% | 10.7% |
| 3 | — | 7169 | 7506 | 7334 | 337 | 4.4% | 4.4% |
| 4 | 1.9 | 6182 | 7501 | 6388 | 1319 | 14.2% | 12.9% |
| 5 | 1.6 | 5470 | 6728 | 5687 | 1258 | 12.8% | 12.7% |
| 6 | 2.3 | 5402 | 6580 | 5636 | 1178 | 11.4% | 11.2% |
| 7 | 1.9 | 5487 | 6624 | 5514 | 1137 | 13.7% | 13.5% |
| 8 | — | 5714 | 6113 | 5539 | 574 | 8.3% | 7.6% |
| 9 | 1.0 | 5249 | 5836 | 5418 | 587 | 7.3% | 7.1% |
| 10 | — | 5508 | 6014 | 5301 | 713 | 7.9% | 6.9% |
| 11 | 1.0 | 5398 | 5805 | 5437 | 407 | 7.1% | 5.8% |
| 12 | 0.67 | 5669 | 6392 | 5598 | 704 | 7.5% | 7.0% |

[1]Chamber near window side "A" (see FIG. 2).
[2]Chamber near center "C" (see FIG. 2).
[3]Chamber near slit valve side "B" (see FIG. 2).
[4]Maximum difference.
[5]Variation in film thickness uniformity, excluding 15 mm from edge of substrate.
[6]Variation in film thickness uniformity, excluding 20 mm from edge of substrate.

Although variation in film thickness increased between Run # 2 (15,000 sccm H$_2$) and Run # 1 (0 sccm H$_2$), and Run # 4 (15,000 sccm H$_2$) and Run # 3 (0 sccm H$_2$), film thickness uniformity appeared to improve between Run # 9 (10,000 sccm H$_2$) and Run # 8 (0 sccm H$_2$), and Run # 11 (10,000 sccm H$_2$) and Run # 10 (0 sccm H$_2$). Overall, the thickness variation of all films was less than 20%.

Table Six, below, provides refractive index and stress measurements for Runs # 1-12.

TABLE SIX

Refractive Index and Stress Measurements for PECVD Deposition
of a-SiN$_x$:H Gate Dielectric Films: Deposition Runs # 1-12

| | | Refractive Index | | | | Film Stress (×10$^9$ cm$^2$) | | | |
|---|---|---|---|---|---|---|---|---|---|
| Run # | NH$_3$:H$_2$ | Window[1] | Center[2] | Slit Valve[3] | Δ Max.[4] | Window[1] | Center[2] | Slit Valve[3] | Δ Max.[4] |
| 1 | — | 1.93 | 1.93 | 1.92 | 0.01 | 2.1 | 0.1 | 2.5 | 2.4 |
| 2 | 1.9 | 1.96 | 1.94 | 1.96 | 0.01 | −2.6 | −4.6 | −2.6 | 2.0 |
| 3 | — | 1.91 | 1.92 | 1.91 | 0.01 | 1.6 | −1.3 | 1.7 | 3.0 |
| 4 | 1.9 | 1.94 | 1.93 | 1.94 | 0.01 | −2.2 | −4.5 | −2.7 | 2.3 |
| 5 | 1.6 | 1.96 | 1.94 | 1.95 | 0.02 | −3.1 | −4.9 | −2.9 | 1.9 |
| 6 | 2.3 | 1.96 | 1.94 | 1.96 | 0.02 | −3.0 | −5.1 | −3.2 | 2.1 |
| 7 | 1.9 | 1.93 | 1.92 | 1.93 | 0.01 | −2.6 | −5.4 | −3.0 | 2.8 |
| 8 | — | 1.87 | 1.88 | 1.87 | 0.01 | −1.8 | −4.2 | −1.3 | 2.9 |
| 9 | 1.0 | 1.89 | 1.89 | 1.89 | 0 | −4.7 | −8.7 | −4.4 | 4.3 |
| 10 | — | 1.87 | 1.87 | 1.87 | 0 | 1.1 | −0.7 | 1.4 | 2.1 |
| 11 | 1.0 | 1.89 | 1.89 | 1.89 | 0 | −1.6 | −5.1 | −2.1 | 3.5 |
| 12 | 0.67 | 1.90 | 1.90 | 1.90 | 0 | −5.8 | −8.9 | −5.9 | 3.1 |

[1]Chamber near window side "A" (see FIG. 2).
[2]Chamber near center "C" (see FIG. 2).
[3]Chamber near slit valve side "B" (see FIG. 2).
[4]Maximum difference.

The refractive indices of all films were within the acceptable range of about 1.85 to about 1.95. The films deposited with H$_2$ had refractive indices which were comparable to, but slightly higher than, the refractive indices of films deposited without H$_2$. All films deposited with H$_2$ were under compressive stress (negative stress values).

A review of all of the data presented in Tables Three through Six and FIGS. 4A-4G and 5A-5E shows that it is possible to obtain an a-SiN$_x$:H gate dielectric film useful as a TFT gate dielectric, where large numbers of the TFTs are arrayed over surface areas larger than about 1000 mm×1000 mm. However, to obtain the uniformity of the film thickness and uniformity of film composition, it is necessary to carefully control the process parameters used in production of the a-SiN$_x$:H gate dielectric film. With respect to uniformity of chemical composition of the film across the wafer, it is preferred that the Si—H bonded structure not vary by more than 4 atomic %. With respect to uniformity of other film properties across the wafer, it is preferred that the variation in stress be less than about 4×10$^9$, and that the wet etch rate (WER), which is also an indication of film density, not vary by more than 100 Å/min over the entire surface of the substrate.

As previously mentioned, to meet industry requirements, the Si—H bonded content of the film should be less than about 15 atomic %; the film stress should range from 0 to about $-1\times10^{10}$ dynes/cm$^2$; the film thickness across the substrate surface area should vary by less than about 20%, and preferably, less than about 17%; the refractive index (RI) of the film should range from about 1.85 to about 1.95; and the wet etch rate in HF solution (which is an indication of film density) should be less than 800 Å/min. In addition, the chemical composition of the film, in terms of Si—H bonded content, should be consistently below the 15 atomic % maximum limit.

An a-SiN$_x$:H gate dielectric film exhibiting the physical characteristics listed above provides excellent performance capabilities, and the uniformity of the film across the substrate enables the production of flat panel displays having surface areas in the range of 25,000 cm$^2$ (2.5 m$^2$), and even larger.

We were surprised to discover that by adding H$_2$ to a precursor gas composition including SiH$_4$, NH$_3$, and N$_2$, the wet etch rate and the wet etch rate uniformity of a-SiN$_x$:H films which are deposited by PECVD are improved, without unreasonably increasing the variation in deposited film thickness across the surface of the substrate.

The combination process parameters required to produce the a-SiN$_x$:H gate dielectric film having wet etch rates in the ranges described above include the following: a substrate temperature during film deposition within the range of about 250° C. to about 450° C., more typically, within the range of about 300° C. to about 400° C., and most typically, within the range of about 320° C. to about 360° C.; a process chamber pressure within the range of about 0.5 Torr to about 3 Torr, and more typically, within the range of about 1 Torr and about 1.5 Torr; a plasma density ranging within the range of about 0.1 W/cm$^2$ to about 1 W/cm$^2$; and a plasma precursor gas composition in which the precursors gases include N$_2$, NH$_3$, SiH$_4$, and H$_2$, where the component ratios are: NH$_3$:SiH$_4$ ranging from about 2:1 to about 15:1, N$_2$:SiH$_4$ ranging from about 5:1 to about 25:1, NH$_3$:N$_2$ ranging from about 1:3 to about 2:1, and NH$_3$:H$_2$ ranging from about 1:2 to about 3:1.

One skilled in the art can calculate an equivalent electrode spacing and precursor gas flow rate when the plasma processing chamber is different from the processing chamber specified above.

An a-SiN$_x$:H film deposited according to the method parameters described above can be used in any application in which a-SiN$_x$:H films are useful. However, as mentioned above, a-SiN$_x$:H film deposited according to the present method are particularly useful in the production of large surface area flat panel displays.

While the invention has been described in detail above with reference to several embodiments, various modifications within the scope and spirit of the invention will be apparent to those of working skill in this technological field. Accordingly, the scope of the invention should be measured by the appended claims.

We claim:

1. A method of PECVD depositing an a-SiN$_x$:H gate dielectric film, to provide an increase in film density and film thickness uniformity across a substrate surface area larger than 100 cm×100 cm, while maintaining an atomic % of SiH bonded structure of less than about 15%, said method comprising:

providing said substrate having a surface area larger than 100 cm×100 cm within a PECVD processing chamber; and depositing said a-SiN$_x$:H gate dielectric film over said substrate from a precursor gas composition including N$_2$, NH$_3$, SiH$_4$, and H$_2$, wherein H$_2$ is provided to said processing chamber in an amount such that a component ratio of NH$_3$:H$_2$ in said plasma precursor gas composition ranges from about 0.5:1 to about 3:1.

2. A method in accordance with claim 1, wherein a component ratio of NH$_3$:H$_2$ in said plasma precursor gas composition ranges from about 1:1 to about 3:1.

3. A method in accordance with claim 1, wherein a component ratio of NH$_3$:SiH$_4$ in said plasma precursor gas composition ranges from about 2:1 to about 15:1, and a component ratio of N$_2$:SiH$_4$ ranges from about 5:1 to about 25:1.

4. A method in accordance with claim 1, wherein an electrode spacing in said process chamber is within the range of about 400 mils to about 1000 mils.

5. A method in accordance with claim 1, wherein said substrate temperature during film deposition is within the range of about 300° C. to about 400° C.

6. A method in accordance with claim 1, wherein said substrate temperature during film deposition is within the range of about 320° C. to about 360° C.

7. A method in accordance with claim 1, wherein said pressure in said process chamber during film deposition is within the range of about 1 Torr to about 1.5 Torr.

8. A method in accordance with claim 1, wherein said substrate surface area is larger than about 25,000 cm$^2$.

9. A method in accordance with claim 1, wherein said substrate surface area is larger than about 40,000 cm$^2$.

10. A method in accordance with claim 1, wherein the variation in said film thickness over said substrate is less than about 20%.

11. A method in accordance with claim 10, wherein the variation in said film thickness over said substrate is less than about 17%.

12. A method in accordance with claim 1, wherein the atomic % of Si—H bonded structure measured at a center of said substrate is less than about 13%.

13. A method in accordance with claim 12, wherein the atomic % of Si—H bonded structure measured at a center of said substrate is less than about 10%.

14. A method in accordance with claim 1, wherein a wet etch rate of said film in a solution of 7% by weight hydrofluoric acid, 34% by weight ammonium fluoride, and 59% by weight water, at a temperature of about 25° C., is less than 800 Å/min.

15. A method in accordance with claim 14, wherein said wet etch rate is less than 500 Å/min.

16. A method in accordance with claim 15, wherein said wet etch rate is less than 400 Å/min.

17. A method in accordance with claim 1, wherein the variation in a wet etch rate of said film in a solution of 7% by weight hydrofluoric acid, 34% by weight ammonium fluoride, and 59% by weight water, at a temperature of about 25° C., is less than 15% across the surface of said substrate.

18. A PECVD apparatus which includes instructions for depositing an a-SiN$_x$:H gate dielectric film having an atomic % of SiH bonded structure of less than about 15%, according to a method comprising:

providing a substrate having a surface area larger than about 1000 mm×1000 mm within a PECVD processing chamber; depositing said a-SiN$_x$:H dielectric film from a precursor gas composition including N$_2$, NH$_3$, SiH$_4$, and H$_2$, wherein H$_2$ is provided to said processing chamber in an amount such that a component ratio of $NH_3:H_2$ in said plasma precursor gas composition ranges from about 0.5:1 to about 3:1.

19. A method in accordance with claim 1, wherein a plasma is applied to said precursor gas composition, so that a plasma density in said processing chamber in which said a-$SiN_x$:H gate dielectric film is deposited is within the range of about 0.1 $W/cm^2$ to about 1 $W/cm^2$.

20. An apparatus in accordance with claim 18, wherein said instructions include applying a plasma to said precursor gas composition, so that a plasma density in said processing chamber in which said a-$SiN_x$:H gate dielectric film is deposited is within the range of about 0.1 $W/cm^2$ to about 1 $W/cm^2$.

* * * * *

UNITED STATES PATENT AND TRADEMARK OFFICE
CERTIFICATE OF CORRECTION

PATENT NO. : 7,884,035 B2
APPLICATION NO. : 12/082554
DATED : February 8, 2011
INVENTOR(S) : Beom Soo Park et al.

It is certified that error appears in the above-identified patent and that said Letters Patent is hereby corrected as shown below:

Col. 1, lines 7-11 should read:

The present application is a continuation application of U.S. Application Serial No. 10/897,775, filed July 23, 2004 now abandoned, and titled "Method Of Controlling The Film Properties Of a CVD-Deposited Silicon Nitride Film".

Col. 11, lines 32-34 continuing at Col. 12, lines 1-18 should read:

In an alternative embodiment structure to that shown in Figure 1, it is possible to deposit the a-SiNx:H gate dielectric layer at a high deposition rate initially (higher than about 1300 Å/min), where the Si-H bonded content may be as high as about 20 atomic %, and then to deposit the a-SiNx:H gate dielectric layer at a low deposition rate (lower than about 1300 Å/min, and typically lower than 1000 Å/min), where the Si-H bonded content is below the 15 atomic % preferred maximum. This provides a good interface between the a-Si layer which is subsequently deposited over the a-SiNx:H gate dielectric layer. The film thickness uniformity across the substrate surface area should vary by less than about 20 %; preferably, less than about 17 %. With respect to uniformity of chemical composition of the film across the substrate, it is preferred that the S-H bonded structure not vary by more than 4 atomic %. With respect to uniformity of other film properties across the wafer, it is preferred that the variation in stress be less than about $4 \times 10^9$, and that the wet etch rate (WER), which is also an indication of density, not vary more than about 100 Å/min over the entire surface of the substrate.

Signed and Sealed this
Tenth Day of July, 2012

David J. Kappos
*Director of the United States Patent and Trademark Office*